(12) United States Patent
Hashimoto

(10) Patent No.: US 10,301,172 B2
(45) Date of Patent: May 28, 2019

(54) CONTACT POINT STRUCTURE, ELECTRONIC DEVICE, AND ELECTRONIC APPARATUS

(71) Applicant: SONY CORPORATION, Tokyo (JP)

(72) Inventor: Mitsuo Hashimoto, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/573,241

(22) PCT Filed: Mar. 31, 2016

(86) PCT No.: PCT/JP2016/060641
§ 371 (c)(1),
(2) Date: Nov. 10, 2017

(87) PCT Pub. No.: WO2016/185808
PCT Pub. Date: Nov. 24, 2016

(65) Prior Publication Data
US 2018/0111822 A1    Apr. 26, 2018

(30) Foreign Application Priority Data
May 19, 2015 (JP) .................................. 2015-101846

(51) Int. Cl.
*B81B 3/00* (2006.01)
*H01H 59/00* (2006.01)

(52) U.S. Cl.
CPC .......... *B81B 3/0072* (2013.01); *B81B 3/0051* (2013.01); *H01H 59/00* (2013.01);
(Continued)

(58) Field of Classification Search
CPC .......... B81B 3/0072; B81B 2203/0136; B81B 2203/053; B81B 2203/051; B81B 2203/0118; B81B 2203/04
See application file for complete search history.

(56) References Cited

U.S. PATENT DOCUMENTS

| 2011/0209970 A1 | 9/2011 | Masuda et al. |
| 2015/0179371 A1* | 6/2015 | Hashimoto .......... H01H 85/463 200/329 |
| 2016/0212542 A1* | 7/2016 | Wang .................... H04R 19/005 |

FOREIGN PATENT DOCUMENTS

| JP | 2002-233998 A | 8/2002 |
| JP | 2006-179384 A | 7/2006 |

(Continued)

OTHER PUBLICATIONS

International Search Report prepared by the Japan Patent Office dated May 18, 2016, for International Application No. PCT/JP2016/060641.

*Primary Examiner* — Selim U Ahmed
(74) *Attorney, Agent, or Firm* — Sheridan Ross P.C.

(57) ABSTRACT

To provide a contact point structure of an electronic device capable of maintaining stable impact resistance. There is provided a contact point structure including: a base portion that is a semiconductor substrate; a movable contact point portion that is supported by the base portion and is a part of a movable member capable of being driven in a predetermined direction; and a fixed contact point portion that faces the movable contact point portion. The fixed contact point portion includes a fixed portion that is supported by the base portion and an extending member that extends from the fixed portion and is capable of being displaced relative to the fixed portion.

11 Claims, 20 Drawing Sheets

(52) U.S. Cl.
 CPC . *B81B 2201/018* (2013.01); *B81B 2201/0235* (2013.01); *B81B 2201/054* (2013.01); *B81B 2203/0118* (2013.01); *B81B 2203/0136* (2013.01); *B81B 2203/04* (2013.01); *B81B 2203/051* (2013.01); *B81B 2203/053* (2013.01)

(56) References Cited

FOREIGN PATENT DOCUMENTS

| | | |
|---|---|---|
| JP | 2011-134506 A | 7/2011 |
| JP | 2011-187373 A | 9/2011 |
| JP | 2012-528305 | 11/2012 |
| JP | 5263203 | 5/2013 |

* cited by examiner

FIG. 9
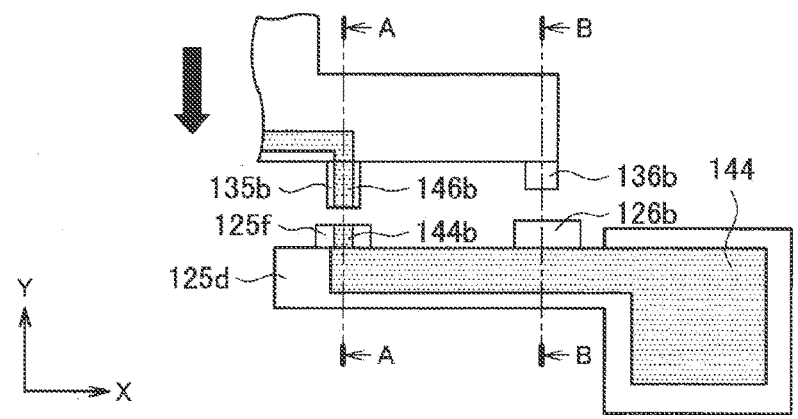
(SECTION ALONG A-A)
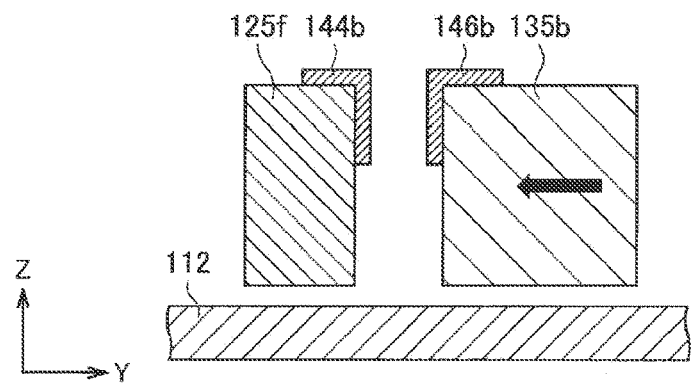
(SECTION ALONG B-B)
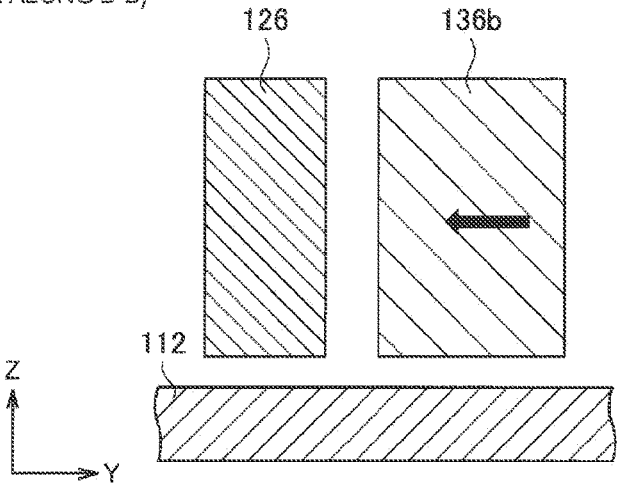

FIG. 11
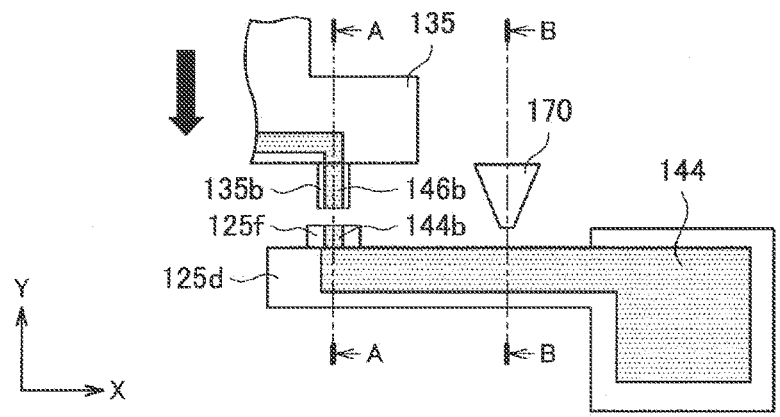
(SECTION ALONG A-A)
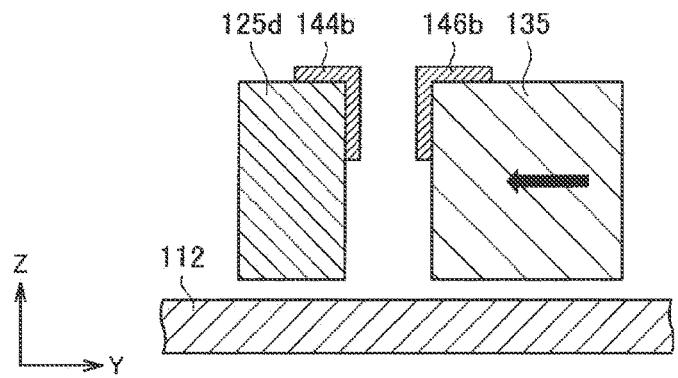
(SECTION ALONG B-B)
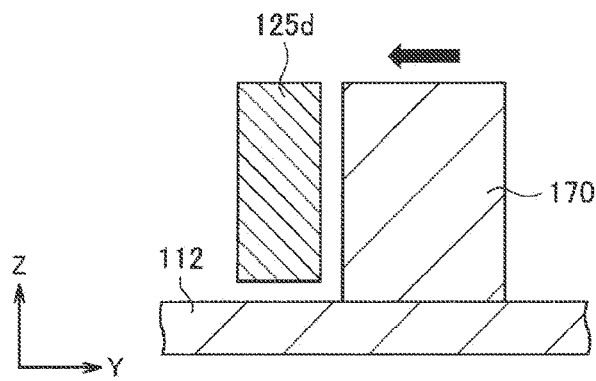

FIG. 13
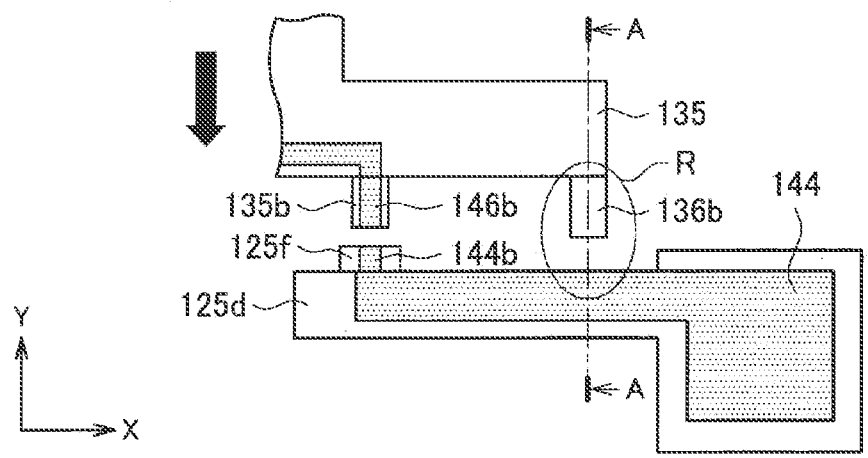
(SECTION ALONG A-A)
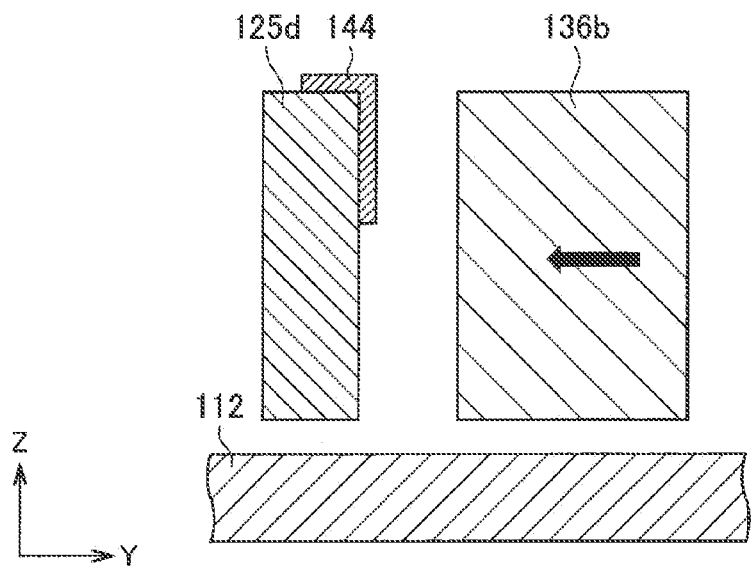

FIG. 14
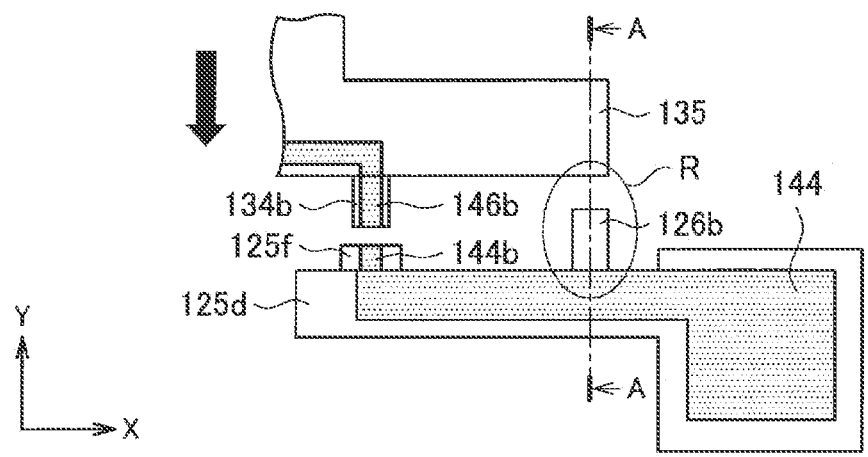
(SECTION ALONG A-A)
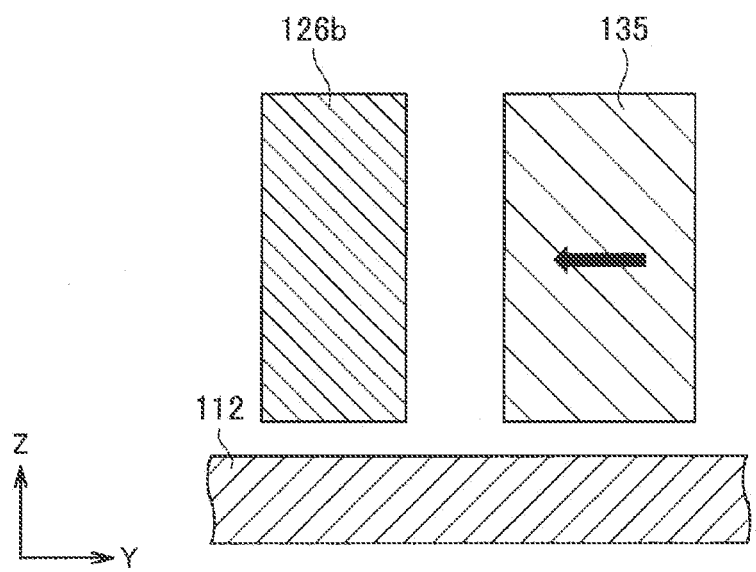

FIG. 17
(SECTION ALONG A-A)
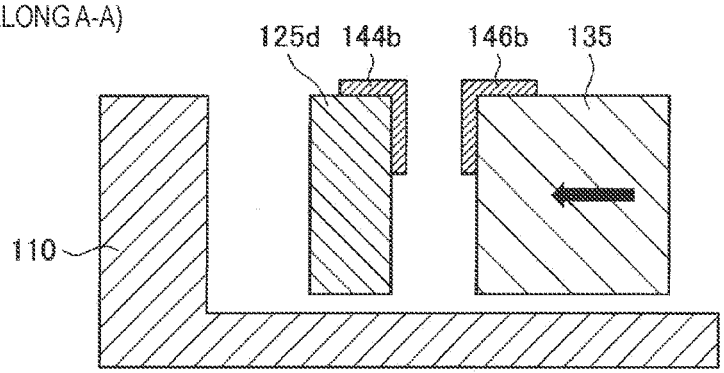
(SECTION ALONG B-B)
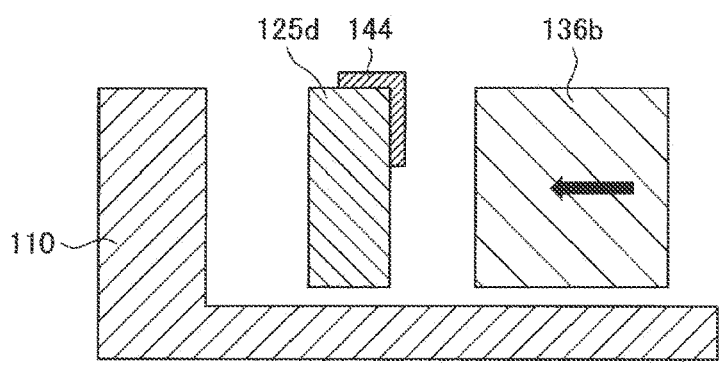
(SECTION ALONG C-C)
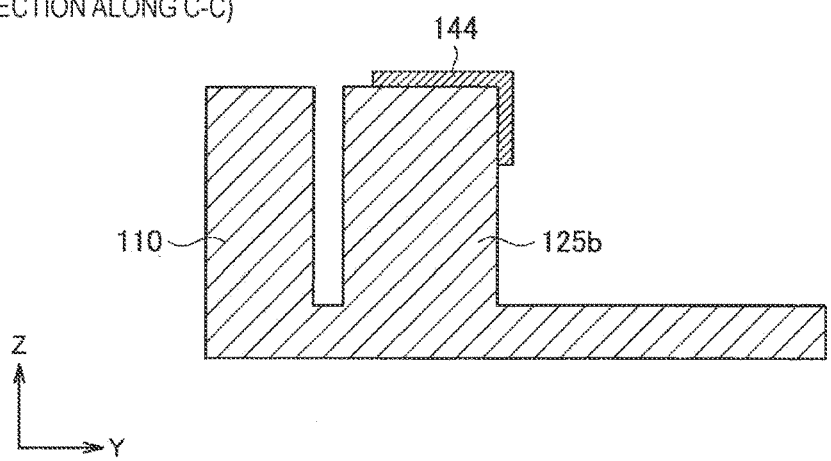

CONTACT POINT STRUCTURE, ELECTRONIC DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2016/060641 having an international filing date of 31 Mar. 2016, which designated the United States, which PCT application claimed the benefit of Japanese Patent Application No. 2015-101846 filed 19 May 2015, the disclosures of which are incorporated herein by reference in their entirety.

TECHNICAL FIELD

The present invention relates to a contact point structure, an electronic device, and an electronic apparatus.

BACKGROUND ART

Electronic devices that have drive units, such as micro electro mechanical systems (MEMS), as switching elements in various sensors and an electronic apparatus have been used. In general, such drive units have a plurality of members (fixed members and movable members, for example) that are configured to relatively move, and desired functions can be realized by controlling the amounts of relative movement of these members.

Here, components in the electronic devices in which contact point mechanisms, such as MEMSs, are provided collide with each other and are damaged if large inertial force acts on the drive units due to the impact from the outside. Thus, the drive units and the contact points of the components are protected by providing stoppers which abut on the drive units or act thereon and dispersing the inertial force outside the contact points of the components.

For example, Patent Literature 1 discloses a micro machine structure in which a spring property is provided in a fixed member and stopper elements are provided in a movable member and the fixed member. Patent Literature 2 discloses an electrostatic relay in which a first spring material and a second spring material are provided in a fixed member and a structure for elastically returning a movable electrode portion such that the second spring material is not deformed until the second spring material abuts on a protrusion is simplified. The spring material with the two-stage structure for the purpose of enhancing a degree of dissociation also contributes to impact resistance.

CITATION LIST

Patent Literature

Patent Literature 1: JP 2012-012023T
Patent Literature 2: JP 5263203B

DISCLOSURE OF INVENTION

Technical Problem

However, a main purpose of the stopper in the related art is to support an actuator, which is a large structure, and load is applied to the contact point portion even after contact with the stopper. Therefore, residual strain is generated and deformation occurs in some cases if a metal with a low yield limit, such as gold, is used for the stopper. If the metal at the contact portion is deformed, a gap at the contact point becomes larger, and electric properties such as contact resistance vary.

Thus, the present disclosure proposes a novel and improved contact point structure, an electronic device, and an electronic apparatus capable of maintaining stable impact resistance.

Solution to Problem

According to the present disclosure, there is provided a contact point structure including: a base portion that is a semiconductor substrate; a movable contact point portion that is supported by the base portion and is a part of a movable member capable of being driven in a predetermined direction; and a fixed contact point portion that faces the movable contact point portion, in which the fixed contact point portion includes a fixed portion that is supported by the base portion and an extending member that extends from the fixed portion and is capable of being displaced relative to the fixed portion.

According to the present disclosure, there is provided an electronic device including the above contact point structure.

Furthermore, according to the present disclosure, there is provided an electronic apparatus including the above electronic device.

Advantageous Effects of Invention

As described above, according to the present disclosure, it is possible to maintain stable impact resistance by the contact point structure. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 9 is an explanatory diagram illustrating a modification example of the contact point structure according to the embodiment.

FIG. 11 is a partial enlarged view illustrating a contact point structure in an electronic device according to a third embodiment of the present disclosure.

FIG. 13 is a partial enlarged view illustrating a contact point structure in an electronic device according to a fifth embodiment of the present disclosure, which illustrates a configuration in which a stopper is provided on a side of a movable contact point portion.

FIG. 14 is a partial enlarged view illustrating the contact point structure in the electronic device according to the embodiment, which illustrates a configuration in which the stopper is provided on a side of a fixed contact point portion.

FIG. 17 shows outline sectional views taken along the line A-A, the line B-B, and the line C-C in FIG. 6.

MODE(S) FOR CARRYING OUT THE INVENTION

Figure 1:
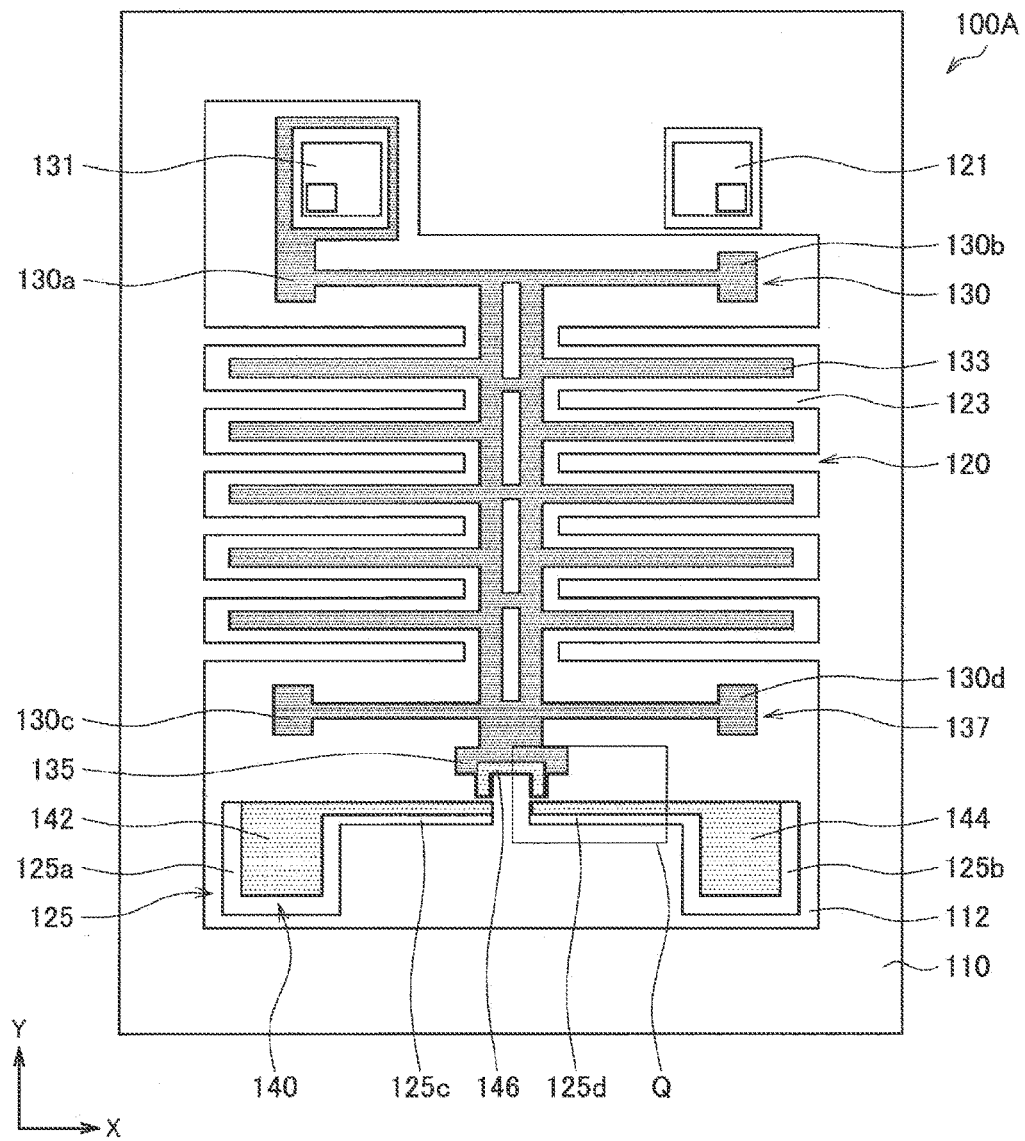
FIG. 1 is an outline planar view illustrating an outline configuration of an electronic device according to a first embodiment of the present disclosure.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Now, description will be given in the following order.
1. First embodiment (movability of fixed contact point portion)
1.1. Outline configuration of electronic device
1.2. Effects of contact point structure
2. Second embodiment (installation of stopper)
2.1. Outline configuration of electronic device
2.2. Effects of contact point structure
2.3. Modification examples
3. Third embodiment (installation of contact point load suppression member)
4. Fourth embodiment (change in components of protrusion)
5. Fifth embodiment (change in components of stopper)
5.1. Effects of contact point structure
5.2. Modification example
6. Application example of electronic device
6.1. Use as switch and relay
6.2. Use as opening and closing valve
7. Supplementary note 1. First Embodiment

[1.1. Outline Configuration of Electronic Device]

First, an outline configuration of an electronic device 100A according to a first embodiment of the present disclosure will be described with reference to FIG. 1. FIG. 1 is an outline planar view illustrating the outline configuration of the electronic device 100A according to the embodiment.

The electronic device 100A according to the embodiment is an MEMS device with an MEMS drive unit formed as a minute movable structure on a semiconductor substrate such as a silicon substrate. The electronic device 100A includes a base portion 110, a fixed member 120, a movable member 130, and a signal pad 140 as illustrated in FIG. 1.

(Base Portion)

The base portion 110 is a member that serves as a substrate of the electronic device 100A. The base portion 110 includes a semiconductor material such as Si, SiC, GaP, or InP or various known materials capable of forming an MEMS other than the semiconductor material. The electronic device 100A is created by sequentially performing various kinds of processing, which is typically performed for creating the MEMS in a semiconductor process, on the base portion 110.

(Fixed Member)

The fixed member 120 forms a drive unit of the electronic device 100A and is a member at a position that does not vary relative to the base portion 110 when an electronic device 10 is driven. The fixed member is formed as a part of the base portion 110. A fixed electrode pad 121 is provided on the fixed member 120. The fixed electrode pad 121 is designed by sequentially laminating an insulating film and a wiring layer on the base portion 110 and forming a contact between the surface of the base portion 110 and the wiring layer, for example. The wiring layer and the surface of the base portion 110 are electrically connected with each other by the contact, and this enables application of a predetermined voltage to fixed electrodes 123.

The plurality of fixed electrodes 123 are formed in a partial region of the fixed member 120 to face movable electrodes 133, which will be described later. The fixed electrodes 123 extend in an X-axis direction from the base portion 110 to mesh with the movable electrodes 133 formed into a comb shape. A voltage applied to the fixed electrodes 123 can be controlled by a voltage of the wiring layer on the surface of the fixed electrode pad 121.

A fixed contact point portion 125 is provided as the fixed member 120 in an etched region 122 in the base portion 110. The fixed contact point portion 125 is provided at a position at which it faces the movable contact point portion 135 of the movable member 130, which will be described later. As illustrated in FIG. 1, the fixed contact point portion 125 includes a first fixed portion 125a on which a first metal pad 142 to which a signal is input is provided and a second fixed portion 125b on which a second metal pad from which a signal is output is provided. The first fixed portion 125a and the second fixed portion 125b have cantilever shapes in which installation portions of the metal pads 142 and 144 are coupled to the base portion 110 while extending members 125c and 125d respectively extending therefrom to the movable contact point portion 135 are not coupled to the base portion. Signal lines extending from the metal pads 142 and 144 are provided on the extending members 125c and 125d, respectively.

The fixed contact point portion 125 is brought into contact with and is separated from the movable contact point portion 135 in accordance with movement of the movable member 130 in a Y-axis direction. Switching between ON and OFF of the signal can be performed by bringing the signal line of the fixed contact point portion 125 and the third metal pad 146 of the movable contact point portion 135 into contact with each other and separating the signal line of the fixed contact point portion 125 from the third metal pad 146 of the movable contact point portion 135. At this time, because the extending members 125c and 125d of the first fixed portion 125a and the second fixed portion 125v are formed into cantilever shapes, it is possible to cause slight warpage by pressing the extending members 125c and 125d into the movable contact point portion 135. That is, the extending members 125c and 125d are sub-movable bodies that are movable in response to movement of the movable member 130.

(Movable Member)

The movable member 130 is a main movable body that forms the drive unit of the electronic device 100A and is relatively movable with respect to the fixed member 120. The movable member 130 is provided in the etched region in the base portion 110 and is separated from the base portion 110 except for a part of coupling portions (130a to 130d, for example) coupled to the base portion 110. In the embodiment, the movable member 130 is movable in the Y-axis direction.

A movable electrode pad 131 is provided on the movable member 130. The movable electrode pad 131 is designed such that an insulating film and a wiring layer are sequentially laminated on the base portion and a contact is formed between the surface of the base portion 110 and the wiring layer, for example, in the same manner as the fixed electrode pad 121. The wiring layer and the surface of the base portion 110 are electrically connected by the contact, and this enables application of a predetermined voltage to the movable electrodes 133.

The plurality of movable electrodes 133 are formed into a comb shape in a partial region of the movable member 130. The movable electrodes 133 extend in the X-axis direction from a central member extending in the Y-axis direction to mesh the aforementioned fixed electrodes 123. The voltage applied to the movable electrodes 133 can be controlled by a voltage of the wiring layer on the surface of the movable electrode pad 131.

The movable member 130 includes the movable contact point portion 135 at a position at which it faces the fixed contact point portion 125. The movable contact point portion 135 is brought into contact with and is separated from the fixed contact point portion 125 in accordance with movement of the central member of the movable member 130 that moves in the Y-axis direction by performing voltage control on the movable electrodes 133 and the fixed electrodes 123. In this manner, the signal line of the fixed contact point portion 125 and the third metal pad 146 of the movable contact point portion 135 are brought into contact with each other and are separated from each other, and switching between ON and OFF of the signal is performed. A returning spring 137 may be provided in the movable member 130 in order to facilitate returning movement for separating the movable contact point portion 135 from the fixed contact point portion 125.

(Signal Pad)

The signal pad 140 is a conductive member for realizing electric conduction when the fixed contact point portion 125 and the movable contact point portion 135 are brought into contact with each other. The signal pad 140 includes a first metal pad 142 provided at the first fixed portion 125a, a second metal pad 144 provided at a second fixed portion 125b, and a third metal pad 146 provided at the movable contact point portion 135. Also, signal lines extending from the first metal pad 142 and the second metal pad 144 are provided on the extending members 125c and 125d. The metal pads 142, 144, and 146 and the signal lines are formed of a metal with electric conductivity such as gold.

[1.2. Effects of Contact Point Structure]

Figure 2:
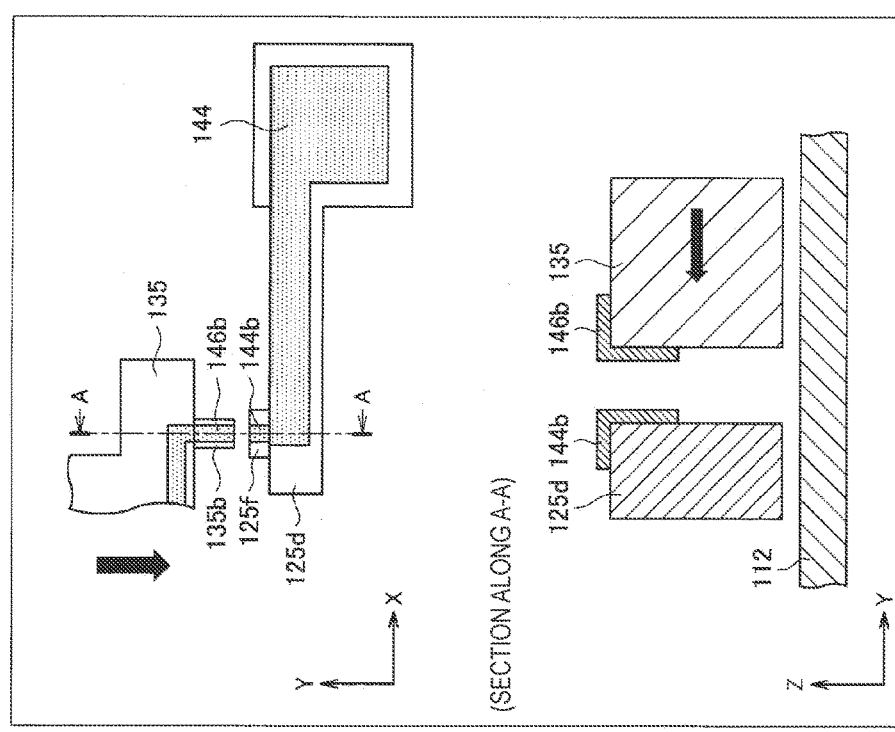
FIG. 2 is a partial enlarged view illustrating details of a contact point structure in the electronic device according to the embodiment.
Figure 3:
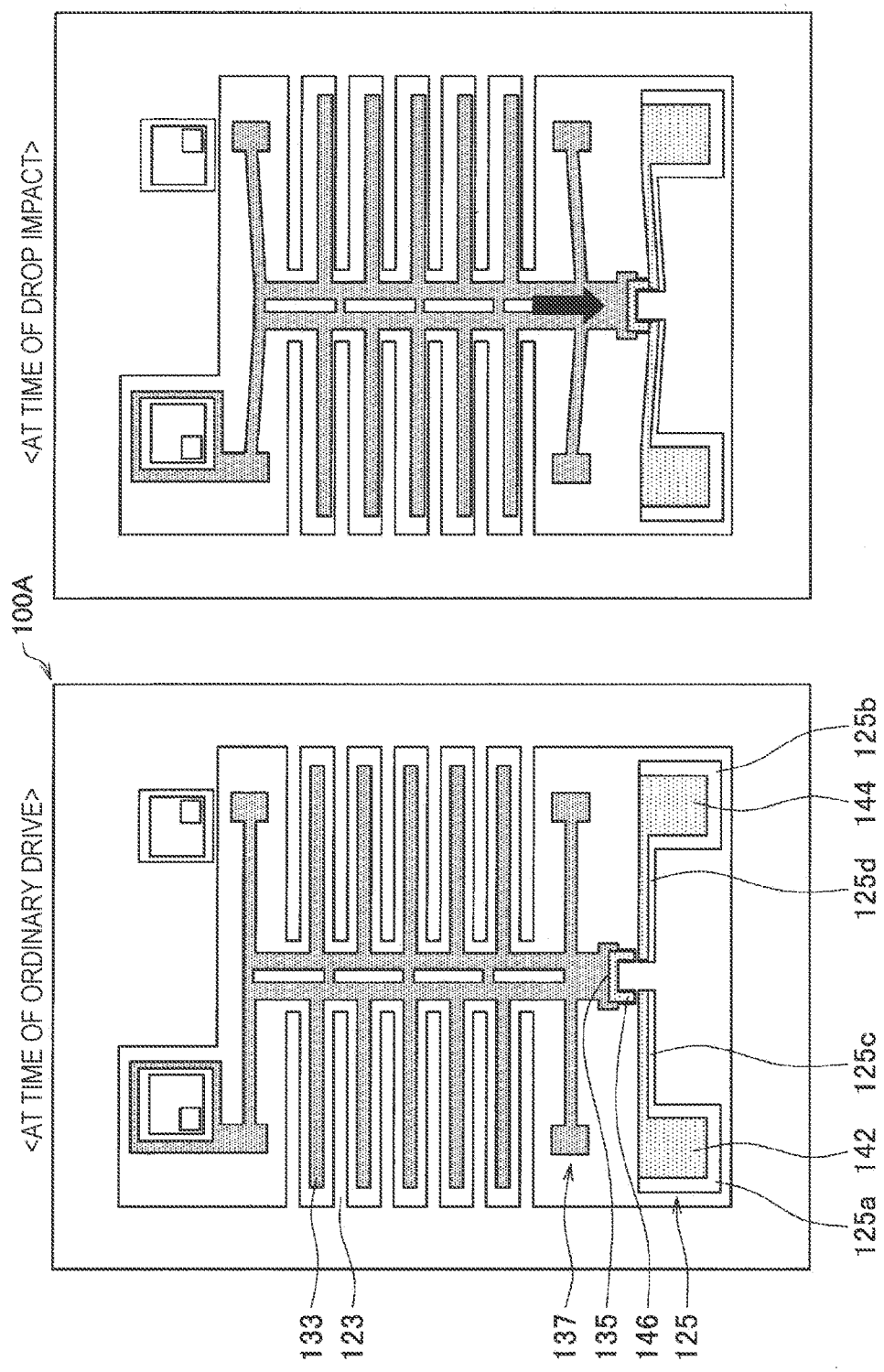
FIG. 3 is an explanatory diagram illustrating an ordinary driven state and a drop impact state of the electronic device according to the embodiment.
Figure 4:
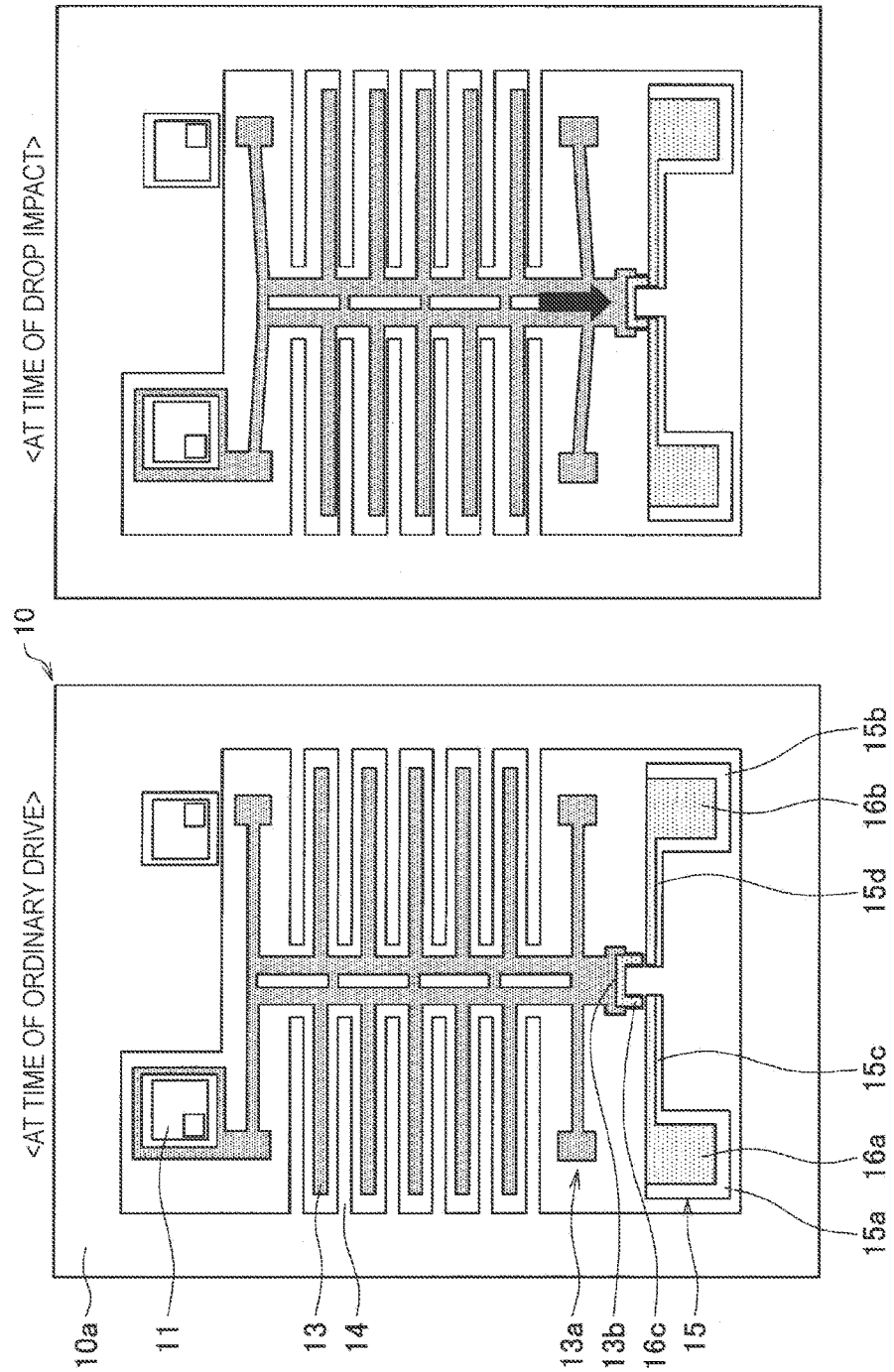
FIG. 4 is an explanatory diagram illustrating an ordinary driven state and a drop impact state of an electronic device according to a related art of the present disclosure.
Figure 5:
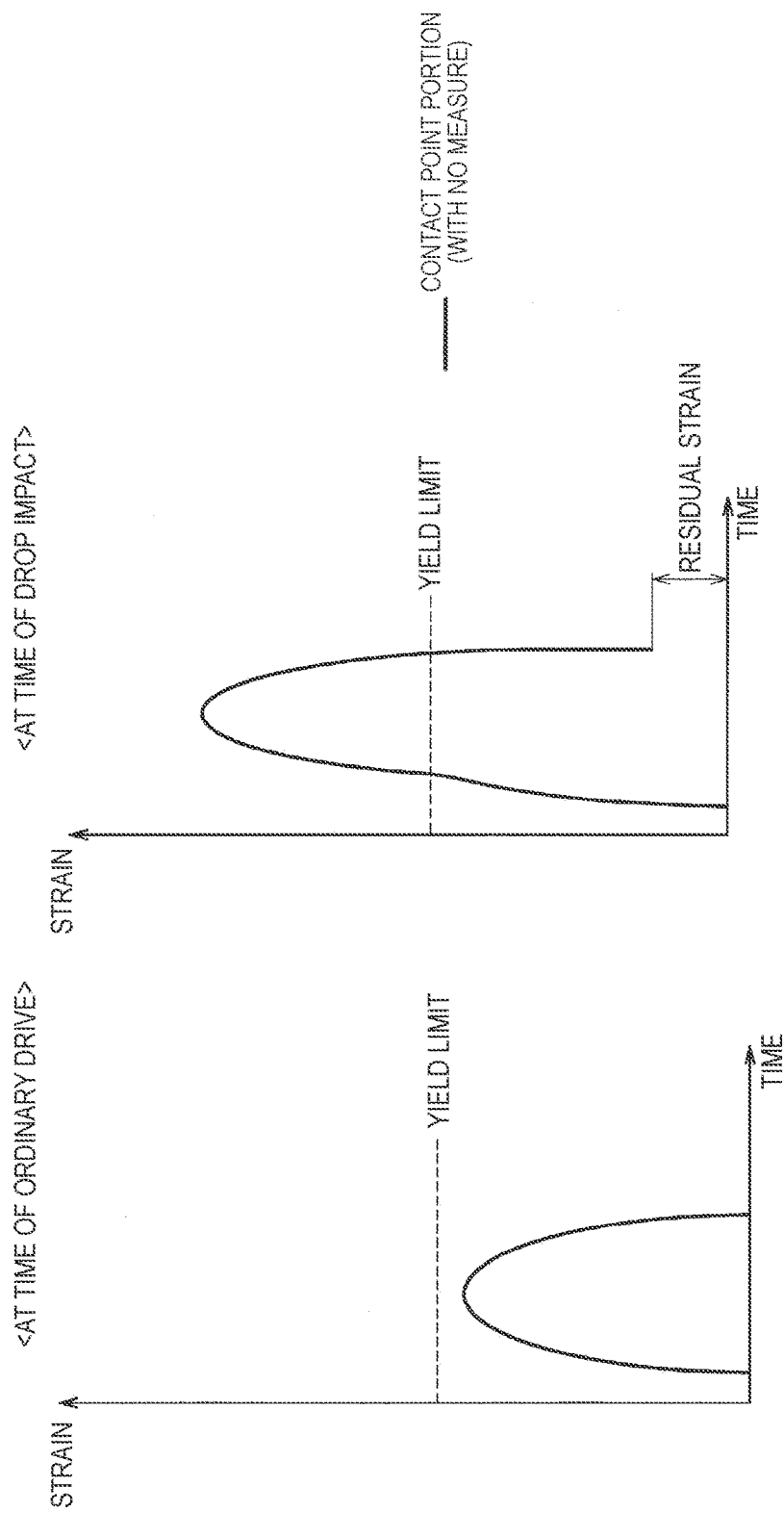
FIG. 5 is an explanatory diagram illustrating contact point deformed states in the ordinary driven state and the drop impact state of the electronic device according to the related art illustrated in FIG. 4.

Next, effects of the contact point structure in the electronic device 100A according to the embodiment will be described with reference to FIGS. 2 to 5. FIG. 2 is a partial enlarged view illustrating details of the contact point structure in the electronic device 100A according to the embodiment. FIG. 3 is an explanatory diagram illustrating an ordinary driven state and a drop impact state of the electronic device 100A according to the embodiment. FIG. 4 is an explanatory diagram illustrating an ordinary driven state and a drop impact state of the electronic device 10 according to the related art of the present disclosure. FIG. 5 is an explanatory diagram illustrating contact point deformed states in the ordinary driven state and the drop impact state of the electronic device 10 according to the related art illustrated in FIG. 4.

In the electronic device 100A according to the embodiment, the extending members 125c and 125d of the fixed contact point portion 125 are movable relative to the base portion 110. This prevents the fixed contact point portion 125 and the movable contact point portion 135 from colliding against each other due to inertial force exceeding that at the time of ordinary drive, such as at the time of drop impact, and prevents plastic deformation of the metal pad at the contact point.

More specifically, a protrusion 125f is provided on the extending member 125d of the fixed contact point portion 125 at a position that faces the movable contact point portion 135, in the region Q in FIG. 1 that is a part of the contact point structure as illustrated on the left side in FIG. 2. Also, a protrusion 135b is formed at the movable contact point portion 135 to face the protrusion 125f of the fixed contact point portion 125. Signal lines 144b and 146b that include a conductive member, such as gold, are provided in facing surfaces of the protrusions 125f and 135f, and the signal lines 144b and 146b are brought into contact with each other by movement of the movable member 130. Although FIG. 2 illustrates the example in which the protrusions 125f and 135b are provided on the fixed contact point portion 125 and the movable contact point portion 135, respectively, the present disclosure is not limited to such an example, and a protrusion may be formed on at least any one of the fixed contact point portion 125 and the movable contact point portion 135.

Here, the extending member 125b of the fixed contact point portion 125 is separated from an etched region 112 of the base portion 110 as illustrated in a lower left portion of FIG. 2. Therefore, since the extending member 125d of the fixed contact point portion 125 is movable even if the movable contact point portion 135 moves toward the side of a negative direction of the Y axis and is brought into contact with the fixed contact point portion 125, the contact point is pressed while sliding, and load applied to the fixed contact point portion 125 and the movable contact point portion 135 is dispersed and absorbed. In this manner, deformation that occurs at the contact portion, at which the fixed contact point portion 125 and the movable contact point portion 135 are brought into contact with each other, does not exceed a yield limit, and no residual strain occurs at the fixed contact point portion 125 and the movable contact point portion 135.

That is, deformation of members (metal pads 142, 144, and 146) that form the contact portion in contact between the fixed contact point portion 125 and the movable contact point portion 135 at the time of ordinary drive is within a range of elastic deformation, and the members return to their original shapes with elapse of time. Even if the fixed contact point portion 125 and the movable contact point portion 135 collide against each other with inertial force exceeding that at the time of ordinary drive, such as at the time of drop impact, the extending members 125c and 125d of the fixed contact point portion 125 are warped, and deformation at the contact portion does not exceed the yield limit. Therefore, no residual strain occurs at the fixed contact point portion 125 and the movable contact point portion 135, and the contact state between the fixed contact point portion 125 and the movable contact point portion 135 is held to be constant. In this manner, the electronic device 100A can maintain stable impact resistance by the contact point structure according to the embodiment.

For comparison, FIG. 4 illustrates the electronic device 10 in which extending members 15c and 15d of the fixed contact point portion 15 are fixed to the base portion 10a as a related art of the electronic device 100A according to the embodiment. That is, in the contact point structure of the electronic device 10 illustrated in FIG. 4, the extending member 15d (15c) of the fixed contact point portion 15 is fixed to the base portion 10a as illustrated in the lower right portion of FIG. 2, and the extending member 15d (15c) of the fixed contact point portion 15 does not move even if the movable contact point portion 13b collides against the fixed contact point portion 15.

Even in such an example, deformation of the members (the signal lines extending from the metal pads 16a and 16b and the metal pad 16c) that form the contact point is within the range of elastic deformation as illustrated on the left side in FIG. 5 in the contact between the fixed contact point portion 15 and the movable contact point portion 13b at the time of ordinary drive. Therefore, the deformation returns to its original shape with elapse of time. However, if the fixed contact point portion 15 and the movable contact point portion 13b collide against each other with inertial force exceeding that at the time of ordinary drive, such as at the time of drop impact, the extending members 15c and 15d of the fixed contact point portion 15 fixed to the base portion 10a receive almost all of the inertial force. Therefore, the metal pads 16a, 16b, and 16c exceed a yield limit and undergo plastic deformation as illustrated on the right side of FIG. 5. Therefore, strain remains in the metal pads 16a, 16b, and 16c even after elapse of predetermined time.

If the signal lines extending from the metal pads 16a and 16b at the contact point and the metal pad 16c undergo plastic deformation, the size of a stroke of the movable member required for reliably bringing the fixed contact point portion 15 and the movable contact point portion 13b into contact with each other changes from that before the plastic deformation. Therefore, if the movable electrodes 13 are driven in the same manner as that before the plastic deformation, there is a possibility of the fixed contact point portion 15 and the movable contact point portion 13b not coming into contact with each other or a contact pressure becoming insufficient, and thus an operation performance of the electronic device 10 being degraded.

As described above, the plastic deformation of the contact portion of the signal lines extending from the metal pads 142 and 144 and the metal pad 146 is prevented by configuring the extending members 125c and 125d of the fixed contact point portion 125 to be movable relative to the base portion 110 as in the electronic device 100A according to the embodiment. In this manner, it is possible to provide the electronic device 100A with stable impact resistance.

2. Second Embodiment

Next, an electronic device 100B according to a second embodiment of the present disclosure will be described. The electronic device 100B according to the embodiment is different from the electronic device 100A according to the first embodiment in that a stopper is provided at a movable contact point portion. Hereinafter, differences between a contact point structure in the electronic device 100B according to the present embodiment and that according to the first embodiment will be mainly described, and detailed description of components similar to those in the first embodiment will be omitted.

[2.1. Outline Configuration of Electronic Device]

Figure 6:
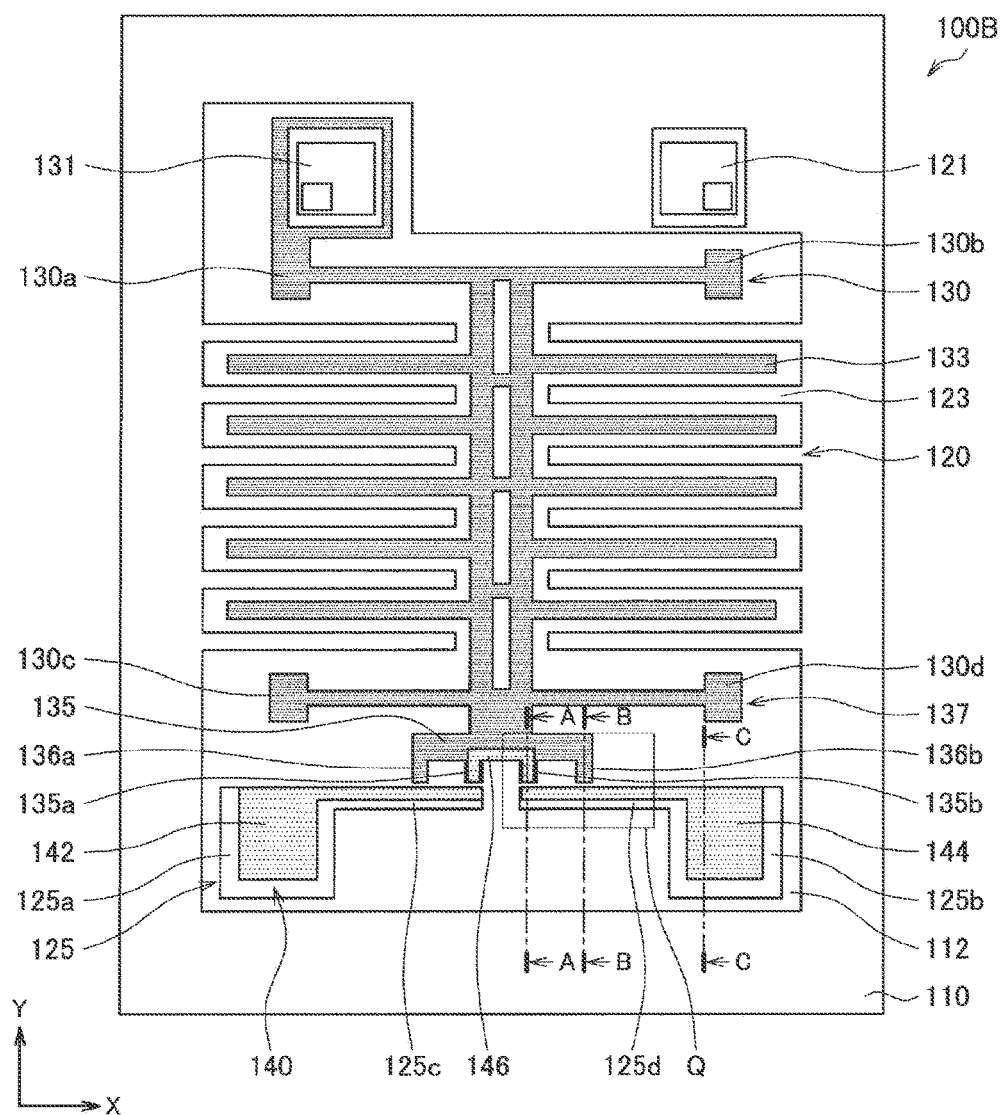
FIG. 6 is an outline planar view illustrating an outline configuration of an electronic device according to a second embodiment of the present disclosure.

First, an outline configuration of the electronic device 100B according to the second embodiment of the present disclosure will be described with reference to FIG. 6. FIG. 6 is an outline planar view illustrating an outline configuration of the electronic device 100B according to the embodiment.

The electronic device 100B according to the embodiment is an MEMS device with an MEMS drive unit formed as a minute movable structure on a semiconductor substrate, such as a silicon substrate, in the same manner as in the first embodiment. The electronic device 100B includes a base portion 110, a fixed member 120, a movable member 130, and a signal pad 140 as illustrated in FIG. 6. Although configurations of the respective parts are substantially the same as those in the first embodiment, the electronic device 100B according to the embodiment is different from the electronic device 100A according to the first embodiment in that stoppers 136a and 136b are provided on a movable contact point portion 135.

The stoppers 136a and 136b are members for separating the contact point between a fixed contact point portion 125 and the movable contact point portion 135 when the fixed contact point portion 125 and the movable contact point portion 135 are brought into contact with each other and the movable contact point portion 135 presses the fixed contact point portion 125 with inertial force that is greater than predetermined force. The stoppers 136a and 136b may be formed of the same material as that for the movable member 130, for example, or may be formed of a different material.

The stoppers 136a and 136b are provided at both ends of the movable contact point portion 135 in a horizontal direction (X-axis direction), for example, to project toward the fixed contact point portion 125 (the negative direction of the Y axis). That is, the stoppers 136a and 136b are provided on the side of the outside of the device beyond protrusions 135a and 135b that serve as contact portions. Also, the stoppers 136a and 136b are formed such that the movable contact point portion 135 is brought into contact with the fixed contact point portion 125 with delay after the protrusions 135a and 135b that serve as contact portions are brought into contact therewith when the movable contact point portion 135 moves toward the side of the fixed contact point portion 125. That is, the stoppers 136a and 136b are formed such that an interval between the fixed contact point portion 125 and the movable contact point portion 135 at the positions of the stoppers 136a and 136b is greater than an interval between the fixed contact point portion 125 and the movable contact point portion 135 at the contact portion in a state in which the movable member 130 is located at an initial position.

[2.2. Effects of Contact Point Structure]

Figure 7:
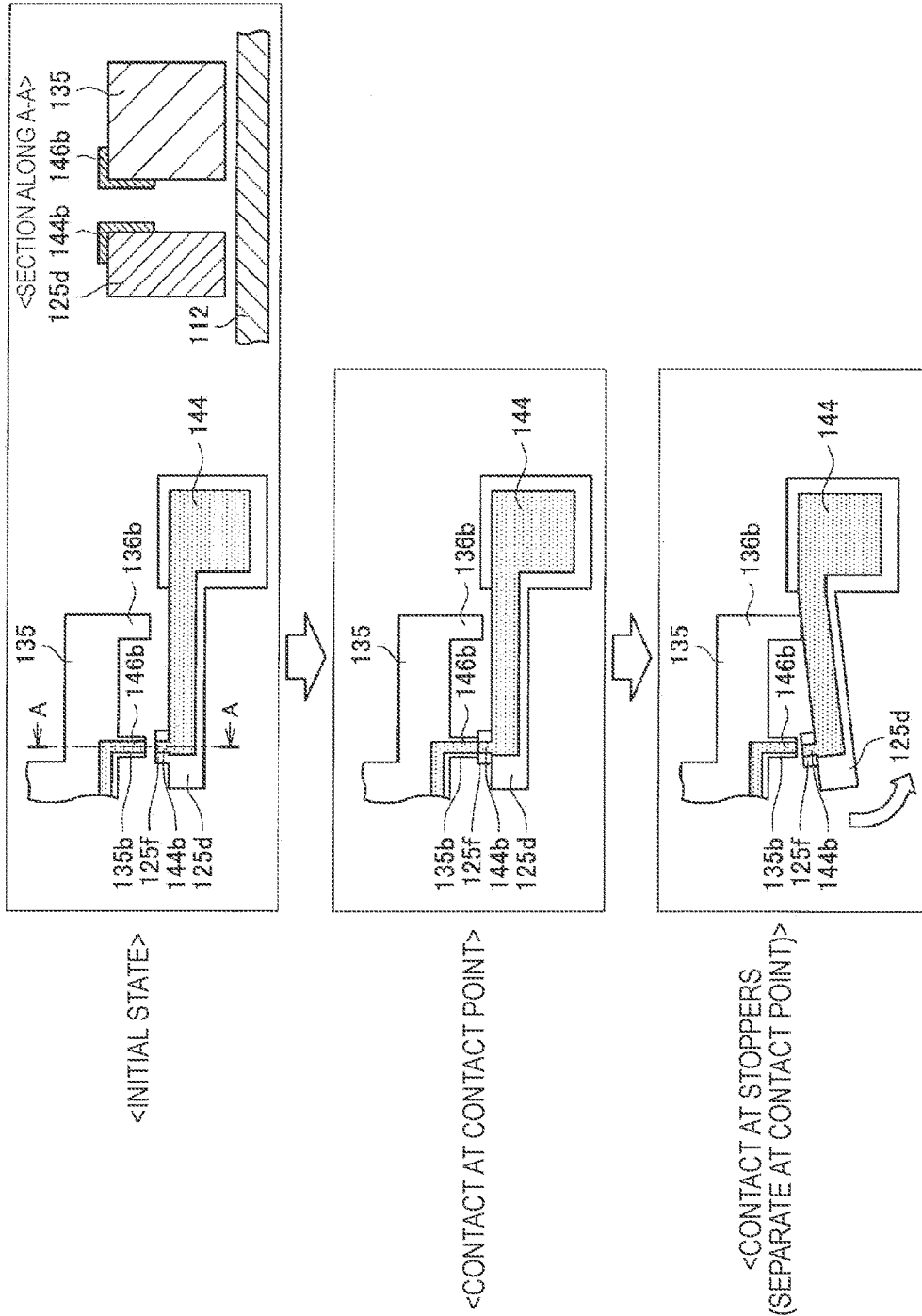
FIG. 7 is a partial enlarged view illustrating a contact point structure in the electronic device according to the embodiment.
Figure 8:
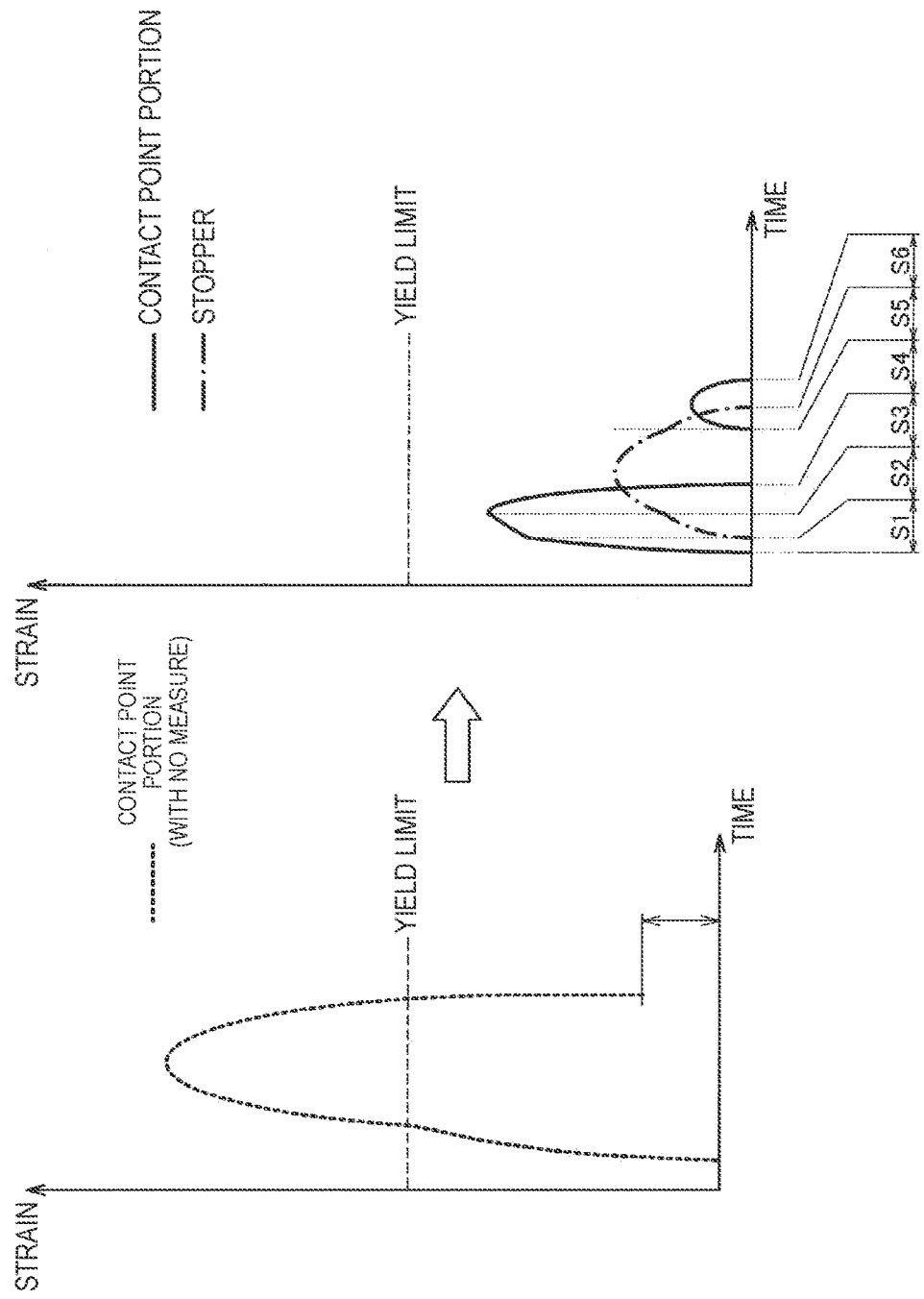
FIG. 8 is an explanatory diagram illustrating deformed states of a contact point portion and stoppers in the electronic device according to the embodiment and a deformed state of a contact point portion in the electronic device according to the related art in the drop impact state.

Hereinafter, effects of the contact point structure in the electronic device 100B according to the embodiment will be described with reference to FIGS. 7 and 8. FIG. 7 is a partial enlarged view illustrating the contact point structure in the electronic device 100B according to the embodiment. FIG. 8 is an explanatory diagram illustrating deformed states of the contact portion and the stoppers in the electronic device 100B according to the embodiment and a deformed state of the contact portion in the electronic device according to the related art in the drop impact state.

The electronic device 100B according to the embodiment is configured such that extending members 125c and 125d of the fixed contact point portion 125 are movable relative to the base portion 110. This prevents the fixed contact point portion 125 and the movable contact point portion 135 from colliding against each other with inertial force exceeding that at the time of ordinary drive, such as at the time of drop impact, and prevents plastic deformation of the metal pads at the contact portion or the signal lines. Furthermore, plastic deformation at the contact portion is prevented by providing the stoppers 136a and 136b in order to prevent inertial force that exceeds the yield limit of the contact portion of the signal lines extending from metal pads 142 and 144 and a metal pad 145 from being applied to the contact portion between the fixed contact point portion 125 and the movable contact point portion 135.

More specifically, a protrusion 125f is provided at the position, which faces the movable contact point portion 135, in an extending member 125d of the fixed contact point portion 125 in the region Q in FIG. 6 that is a part of the contact point structure as illustrated in FIG. 7. Also, the protrusion 135b is provided so as to face the protrusion 125f of the fixed contact point portion 125. Signal lines 144b and 146b extending from the metal pads 144 and 146 that include a conductive member such as gold are provided in the facing surfaces of the protrusions 125f and 135b, and the signal lines 144b and 136b are brought into contact with each other in response to movement of the movable member 130. The extending member 125d of the fixed contact point portion 125 is also separated from an etched region 112 of the base portion 110 in the embodiment. Also, the stopper 136b projecting toward the fixed contact point portion 125 is provided at the movable contact point portion 135 in the embodiment.

As for a change in states in a case where the fixed contact point portion 125 and the movable contact point portion 135 collide against each other with inertial force exceeding that at the time of ordinary drive, such as at the time of drop impact, in such a contact point structure, the fixed contact point portion 125 and the movable contact point portion 135 are in the separate state in the initial state as illustrated on the upper side of FIG. 7.

Then, if impact is applied to the electronic device 100B and the movable member 130 moves, the fixed contact point portion 125 and the movable contact point portion 135 are brought into contact with each other as illustrated at the center in FIG. 7, and deformation of the signal lines 144b and 146 starts. This state corresponds to the state in Step S1 on the right side in FIG. 7, and the deformation of the signal lines 144b and 146b occurs within the range of elastic deformation. The stopper 136b is not yet in contact with the fixed contact point portion 125 in this stage.

Furthermore, if the movable contact point portion 135 is pressed into the fixed contact point portion 125, the stopper 136b of the movable contact point portion 135 is brought into contact with the fixed contact point portion 125. This state corresponds to the state in Step S2 on the right side in FIG. 8, and deformation of the stopper 136b starts while deformation (strain) of the signal lines 144b and 144 becomes moderate. Then, as a result of continuously pressing the movable contact point portion 135 into the fixed contact point portion 125, the protrusion 125f and the protrusion 135b that form the contact point start to be separated from each other, and strain at the contact portion is eliminated. This state corresponds to the state in Step S3 on the right side in FIG. 8.

After separation occurs at the contact portion and the contact point is eliminated, only the stopper 136b is in contact with the fixed contact point portion 125 as illustrated on the lower side in FIG. 7, and the deformation of the stopper 135b becomes larger. This state corresponds to the state in Step S4 on the right side in FIG. 8. At this time, the stopper 136b is deformed within the range of elastic deformation. Then, if inertial force due to the impact becomes weaker, the deformation of the stopper 136b starts to return with elapse of time, and warpage of the extending member 125d of the fixed contact point portion 125 becomes moderate. As a result, the protrusion 125f and the protrusion 135 start to be in contact with each other again, and the signal lines 144b and 146b starts to be slightly deformed. This state corresponds to the state in Step S5 on the right side in FIG. 8. As time further passes, warpage caused at the contact point when the protrusions 125f and 135b are brought into contact with each other again is eliminated as in Step S6 on the right side in FIG. 8.

As described above, even if the movable contact point portion 135 is brought into contact with the fixed contact point portion 125 in a state where large impact acceleration is applied due to dropping or the like, the extending member 125d of the fixed contact point portion 125 is pressed while sliding, and load applied thereto is dispersed and absorbed by the contact point structure according to the embodiment in the same manner as in the first embodiment. Also, since the stopper 136b acts before the yield limit of the members (the signal lines 144b and 146b in this case) at the contact portion is exceeded, the contact point is eliminated, and the load on the contact portion is eliminated. Therefore, no strain remains at the contact portion between the fixed contact point portion 125 and the movable contact point portion 135, and it is possible to provide the electronic device 100B with stable impact resistance.

[2.3. Modification Examples]

Although the stopper 136b is provided at the movable contact point portion 135 in the contact point structure illustrated in FIG. 7, the present disclosure is not limited to such an example. For example, the stopper may be formed in at least one of the fixed contact point portion 125 and the movable contact point portion 135. For example, FIGS. 9 and 10 are explanatory diagrams illustrating modification examples of the contact point structure according to the embodiment.

As illustrate in FIG. 9, for example, the extending member 125d of the fixed contact point portion 125 may be provided with a stopper 126b. FIG. 9 illustrates only a part corresponding to the region Q in FIG. 6, and the extending member 125c of the fixed contact point portion 125, which is not illustrated in the drawing, is also provided with a stopper 126a. The stopper 126a and 126b are provided so as to face the stoppers 136a and 136b of the movable contact point portion 135. Although protrusion heights of the respective stoppers 126a, 126b, 136a, and 136b in the Y-axis direction can be appropriately set, the stoppers are set such that the signal lines 144b and 146b at the contact portion are brought into contact first and the stoppers are then brought into contact when the movable member 130 moves from an initial state in the same manner as in the contact point structure in FIG. 7.

Figure 10:
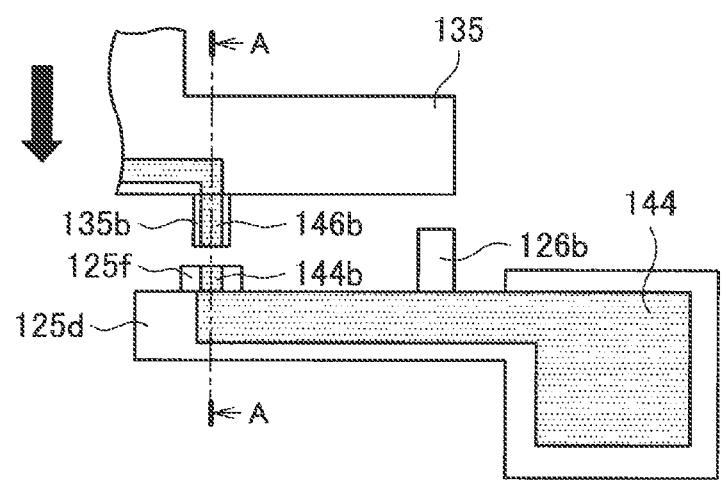
FIG. 10 is an explanatory diagram illustrating another modification example of the contact point structure according to the embodiment.

As illustrated in FIG. 10, only the extending member 125d of the fixed contact point portion 125 may include the stopper 126. FIG. 10 also illustrates only the portion corresponding to the region Q in FIG. 6, and the extending member 125c of the fixed contact point portion 125, which is not illustrated, is also provided with the stopper 126a. The stoppers 126a and 126b are provided so as to face the movable contact point portion 135. Although the protrusion heights of the respective stoppers 126a and 126b in the Y-axis direction can be appropriately set, the stoppers 126a and 126b are formed such that the signal lines 144b and 146b at the contact portion are brought into contact first and the stoppers are then brought into contact when the movable member 130 moves from the initial state in the same manner as in the contact point structure in FIG. 7.

3. Third Embodiment

Next, a contact point structure in an electronic device according to a third embodiment of the present disclosure will be described. The contact point structure in the electronic device according to the embodiment is different from that in the electronic device 100A according to the first embodiment in that a contact point load suppression member 170 is provided. Hereinafter, differences between the contact point structure in the electronic device according to the embodiment and that in the first embodiment will be mainly described, and detailed description of the same components as those in the first embodiment will be omitted. Also, the entire configuration of the electronic device is the same as that in FIG. 1 except that the contact point load suppression member 170 is provided.

Effects of the contact point structure in the electronic device according to the embodiment will be described with reference to FIG. 11. FIG. 11 is a partial enlarged view illustrating the contact point structure in the electronic device according to the embodiment.

The contact point structure in the electronic device according to the embodiment is configured such that extending members 125c and 125d of a fixed contact point portion 125 are movable relative to a base portion 110 in the same manner as in the first embodiment. This prevents the fixed contact point portion 125 and a movable contact point portion 135 from colliding against each other with inertial force exceeding that at the time of ordinary drive, such as at the time of drop impact or the like, and prevents plastic deformation of metal pads or signal lines at the contact portion. Furthermore, the effect that the movable contact point portion 135 presses the fixed contact point portion 125 to an initial state is restricted by counterforce caused when the fixed contact point portion 125 and the movable contact point portion 135 are restored after the fixed contact point portion 125 and the movable contact point portion 135 are brought into contact with each other by providing the contact point load suppression member 170. In this manner, it is possible to suppress application applied to the contact portion at the time of the restoration.

More specifically, a protrusion 125f is provided at a position, which faces the movable contact point portion 135, in the extending member 125d of the fixed contact point portion 125 in the region Q in FIG. 1 that is a part of the contact point structure as illustrated in FIG. 11. Also, a protrusion 135b is formed in the movable contact point portion 135 so as to face the protrusion 125f of the fixed contact point portion 125. Signal lines 144b and 146b including a conductive member, such as gold, are provided in the facing surfaces of the protrusions 125f and 135b, and the signal lines 144b and 146b are brought into contact with each other in response to movement of the movable member 130. The extending member 125d of the fixed contact point portion 125 is also separated from the etched region 112 of the base portion 110 as illustrated in the sectional view taken along A-A in FIG. 11 in this embodiment.

In the electronic device according to the embodiment, the contact point load suppression member 170 is provided as the contact point structure so as to face the extending member 125d of the fixed contact point portion 125 as illustrated in FIG. 11. The contact point load suppression member 170 is a member fixed to the base portion 11 as illustrated in the sectional view taken along B-B in FIG. 11 and may be formed of the same material as that of the base portion 110, for example.

According to such a contact point structure, the movable contact point portion 135 moves toward the side of the negative direction of the Y axis and is brought into contact with the fixed contact point portion 125 if impact of drop or the like is applied in the initial state as illustrated in FIG. 11. Since the extending member 125d of the fixed contact point portion 125 is movable at this time, the extending member 125d is pressed by the movable member 130 while sliding, and load applied to the fixed contact point portion 125 and the movable contact point portion 135 is dispersed and absorbed. In this manner, the deformation at the contact portion does not exceed the yield limit, and no residual strain occurs at the fixed contact point portion 125 and the movable contact point portion 135.

Meanwhile, if the extending member 125d of the fixed contact point portion 125 is considerably warped when the inertial force due to impact is weakened and the fixed contact point portion 125 and the movable contact point portion 135 are about to be restored to the initial states after the contact therebetween, the fixed contact point portion 125 presses the movable contact point portion 135 upward by the counterforce thereof. If large counterforce is applied to the movable contact point portion 135 at this time, large load is applied to the contact portion. Thus, movement of the extending member 125d of the fixed contact point portion 125 is restricted at the time of restoration by providing the contact point load suppression member 170. Although the fixed contact point portion 125 and the movable contact point portion 135 are in contact with each other at the time of the start of the restoration, the extending member 125d abuts on the contact point load suppression member 170 in the process of the restoration, and the movement of the extending member 125d is suppressed. Meanwhile, the movable contact point portion 135 is displaced to the initial state at the same movement speed.

As described above, it is possible to suppress the load on the contact portion and to constantly hold the contact state between the fixed contact point portion 125 and the movable contact point portion 135 by suppressing the amount of movement of the extending member 125d of the fixed contact point portion 125 at the time of the restoration.

Therefore, the electronic device can hold stable impact resistance by the contact point structure according to the embodiment.

4. Fourth Embodiment

Next, a contact point structure in an electronic device according to a fourth embodiment of the present disclosure will be described. The contact point structure in the electronic device according to the embodiment is different from that in the electronic device 100A according to the first embodiment in that a material with high yield stress is used for a contact portion between a fixed contact point portion 125 and a movable contact point portion 135. Hereinafter, differences between the contact point structure in the electronic device according to the embodiment and that in the first embodiment will be mainly described, and detailed description of the same components as those in the first embodiment will be omitted. Also, the entire configuration of the electronic device are the same as that in FIG. 1 except for the difference in the material at the contact portion.

Figure 12:
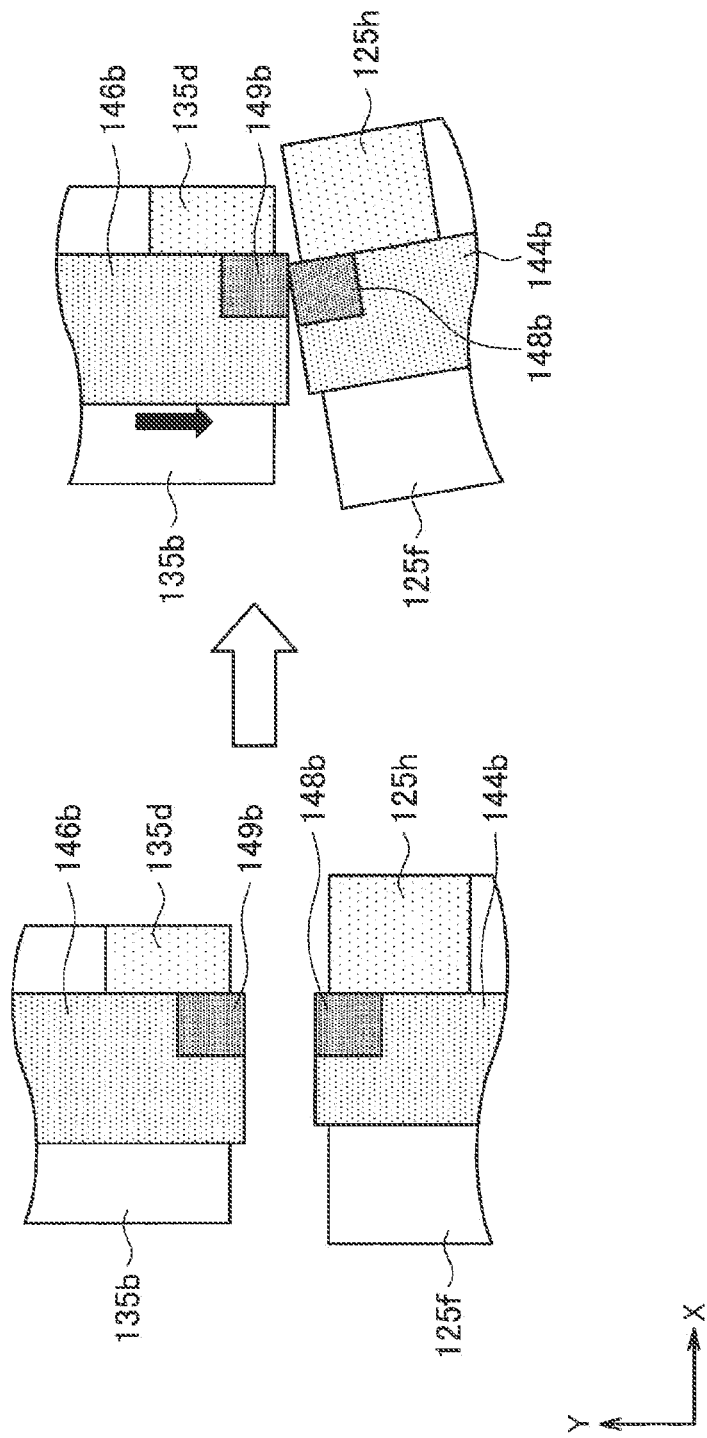
FIG. 12 is a partial enlarged view illustrating a configuration of a contact point portion in an electronic device according to a fourth embodiment of the present disclosure.

Effects of the contact point structure in the electronic device according to the embodiment will be described with reference to FIG. 12. FIG. 12 is an explanatory diagram illustrating a configuration of a contact portion between the fixed contact point portion 125 and the movable contact point portion 135 in the electronic device according to the embodiment. The contact point structure in the electronic device according to the embodiment is the same as that illustrated in the upper left diagram in FIG. 2 illustrated in the first embodiment, and FIG. 12 is an enlarged view of protrusions 125$f$ and 135$b$ in the contact point structure.

That is, the contact point structure in the electronic device according to the embodiment is configured such that extending members 125$c$ and 125$d$ of the fixed contact point portion 125 are movable relative to the base portion 110 in the same manner as in the first embodiment. This prevents the fixed contact point portion 125 and the movable contact point portion 135 from colliding against each other with inertial force exceeding that at the time of ordinary drive, such as at the time of drop impact or the like, and prevents plastic deformation of the contact portion. In addition, a partial material of the contact portion between the fixed contact point portion 125 and the movable contact point portion 135 is replaced with a material with higher yield stress than those of materials for the metal pads and the signal lines in order to suppress the plastic deformation in the contact point structure according to the embodiment.

Specifically, protrusions 125$f$ and 135$b$ in the contact point structure are provided with signal lines 144$b$ and 146$b$ as illustrated in FIG. 12, and electric connection is established by the contact therebetween. At this time, the amount of displacement of the extending member 125$d$ caused by being pressed by the movable contact point portion 135 becomes greater at a farther location from the second fixed portion 125$b$ fixed to the base portion 110. That is, larger load is applied to a contact portion closer to the second fixed portion 125$b$ fixed to the base portion 110 that serves as a support point. Thus, at least a part of the contact portion (preferably, on the side closer to the second fixed portion 125$b$ fixed to the base portion 110) is formed of the material with higher yield stress than that of the signal lines 144$b$ and 146$b$. In this manner, plastic deformation at the contact point portion can be suppressed when impact of drop or the like is received. If the signal lines 144$b$ and 146$b$ include gold, for example, the material with high yield stress includes stainless steel.

The high yield stress member including the material with high yield stress may be provided on the protrusions 125$f$ and 135$b$ by sputter deposition or the like (high yield stress members 125$h$ and 135$d$), or may be provided on the signal lines 144$b$ and 146$b$ by sputter deposition or the like (high yield stress members 148$b$ and 149$b$) as illustrated in FIG. 12. It is a matter of course that the high yield stress members 125$h$, 135$d$, 148$b$, and 149$b$ may be provided on the protrusions 125$f$ and 135$b$ and the signal lines 144$b$ and 146$b$, respectively.

5. Fifth Embodiment

Next, a contact point structure in an electronic device according to a fifth embodiment of the present disclosure will be described. The contact point structure in the electronic device according to the embodiment is different from that in the electronic device 100B according to the second embodiment in that a material of the stopper is changed. Hereinafter, differences between the contact point structure in the electronic device according to the embodiment and that in the second embodiment will be mainly described, and detailed description of the same components as those in the second embodiment will be omitted. The entire configuration of the electronic device is the same as that in FIG. 2 except for the difference in the material of the stopper.

[5.1. Effects of Contact Point Structure]

Effects of the contact point structure in the electronic device according to the embodiment will be described with reference to FIGS. 13 and 14. FIG. 13 is a partial enlarged view illustrating the contact point structure in the electronic device according to the embodiment, which illustrates a configuration in which a stopper 136$b$ is provided on the side of a movable contact point portion 135. FIG. 14 is a partial enlarged view illustrating the contact point structure in the electronic device according to the embodiment, which illustrates a configuration in which a stopper 126$b$ is provided on the side of a fixed contact point portion 125. Although FIGS. 13 and 14 illustrate only the portion corresponding to the region Q in FIG. 6, the same configuration is formed so as to be horizontally symmetric about a center member of a movable member 130 in the electronic device.

First, the extending members 125$c$ and 125$d$ of the fixed contact point portion 125 are included in the base portion 110 in the electronic device illustrated in FIG. 13. This prevents the fixed contact point portion 125 and the movable contact point portion 135 from colliding against each other with inertial force exceeding that at the time of ordinary drive, such as at the time of drop impact or the like, and prevents plastic deformation of the metal pads or the signal lines at the contact portion. Furthermore, the plastic deformation at the contact portion is prevented by providing stoppers 136$a$ and 136$b$ at the movable contact point portion 135 such that the inertial force exceeding the yield limits of the metal pads 142, 144, and 146 or the signal lines is not applied to the contact portion between the fixed contact point portion 125 and the movable contact point portion 135.

Here, the stoppers 136$a$ and 136 according to the embodiment are formed of a semiconductor material or a metal material. If the stoppers 136$a$ and 136$b$ are formed of the semiconductor material, the stoppers 136$a$ and 136$b$ may be formed of the same material as that for the base portion 110, such as Si. For example, it is assumed that the stoppers 136$a$ and 136$b$ are formed of Si, which is the same material as that for the base portion 110, and the metal pads 142 and 144 are formed of gold. At this time, the Young's modulus of Si is about a double of the Young's modulus of gold that forms the metal pad 144. Therefore, even if the same load as that applied to the metal pads 142 and 144, which are in contact with the stoppers 136a and 136b, is applied to the stoppers 136a and 136b, the amount of strain of the stoppers 136a and 136b is reduced by about a half. In this manner, the protrusions 125f and 135b at the contact portion between the fixed contact point portion 125 and the movable contact point portion 135 tend to be separated from each other, and the load on the contact portion can be reduced.

If the stoppers 136a and 136b are formed of the metal material, the stoppers 136a and 136b may be formed of the same material as that for the metal pads 142, 144, and 146 or for the signal lines, for example. For example, the stoppers 136a and 136b may be formed of gold. The interval between the stoppers 136a and 136b and the fixed contact point portion 125 is an important design value that may affect the performance of the electronic device. Forming the stoppers 136a and 136b and the metal pads 142, 144, and 146 or the signal lines from the same material has an advantage that it is possible to precisely form them in the same process and to easily control the interval between the stoppers 136a and 136b and the fixed contact point portion 125.

The stoppers 126a and 126b may be formed of the semiconductor material or the metal material in the same manner even if the stoppers 126a and 126b are formed on the side of the fixed contact point portion 125 as illustrated in FIG. 14. If the stoppers 126a and 126b are formed of the semiconductor material, it is possible for the stoppers 126a and 126b to bear larger force since the stoppers 126a and 126b are formed of a hard material, the protrusions 125f and 135b at the contact portion tend to be separate, and the load on the contact portion can be reduced. Forming the stoppers 126a and 126b from the metal material has an advantage that it is possible to easily control the interval between the stoppers 136a and 136b and the fixed contact point portion 125 by forming the stoppers 126a and 126b from the same material as that for the metal pads 142, 144, and 146 or the signal lines.

[5.2. Modification Example]

In the aforementioned configuration in which the stoppers are provided as illustrated in FIGS. 13 and 14, the contact portion between the stoppers and the members that face the stoppers, for example, may be formed of a material with high yield stress in order to further suppress the plastic deformation of the stoppers. Iron, stainless steel, or the like may be used as the material with high yield stress.

Figure 15:
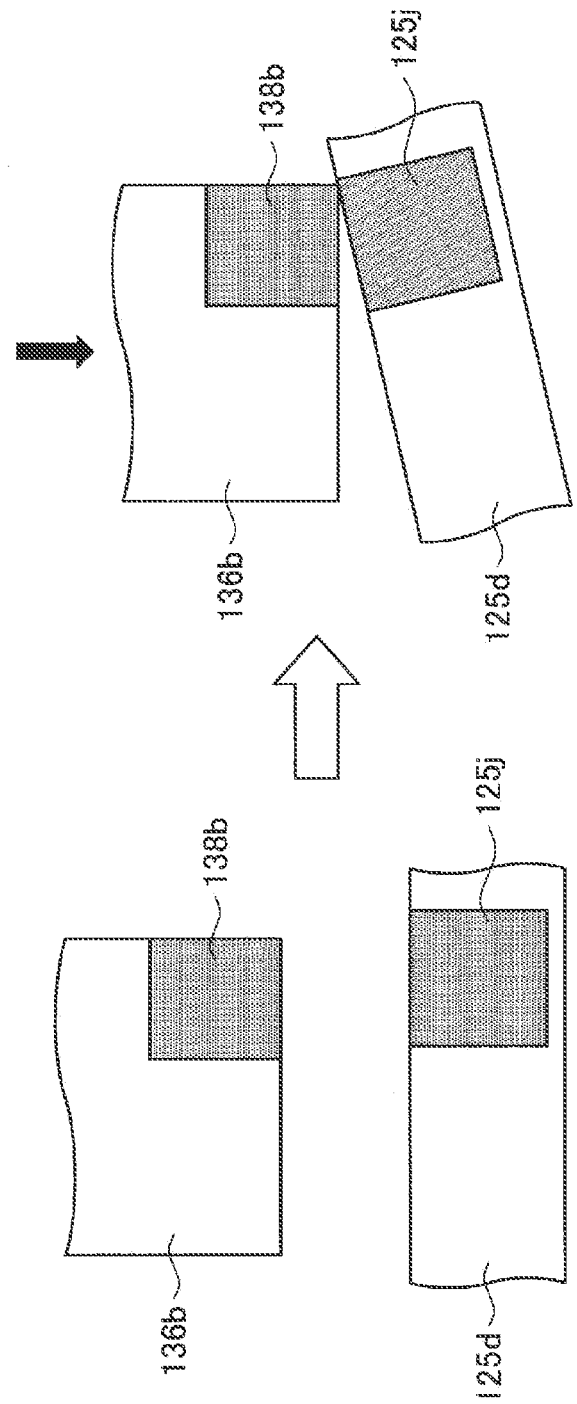
FIG. 15 is an explanatory diagram illustrating a case in which a contact portion between the stopper and a member facing the stopper is formed of a high yield stress material in the configuration in FIG. 13.

For example, the stopper 136b and the extending member 125 of the fixed contact point portion 125 that faces the stopper 136b as illustrated in FIG. 13 may be provided with high yield stress members 138b and 125j, respectively, as illustrated in FIG. 15. FIG. 15 is a partial enlarged view of the region R in FIG. 13. As illustrated in FIG. 13, portions, which are located closer to the side of the second fixed portion 125b that serves as a support point, of the stopper 136b and the extending member 125d are brought into contact with each other first. Thus, it is possible to suppress the plastic deformation of the contact portion by providing the high yield stress members 138b and 125j at least on the side, which is closer to the support point, of the contact portion between the stopper 136b and the extending member 125d.

Figure 16:
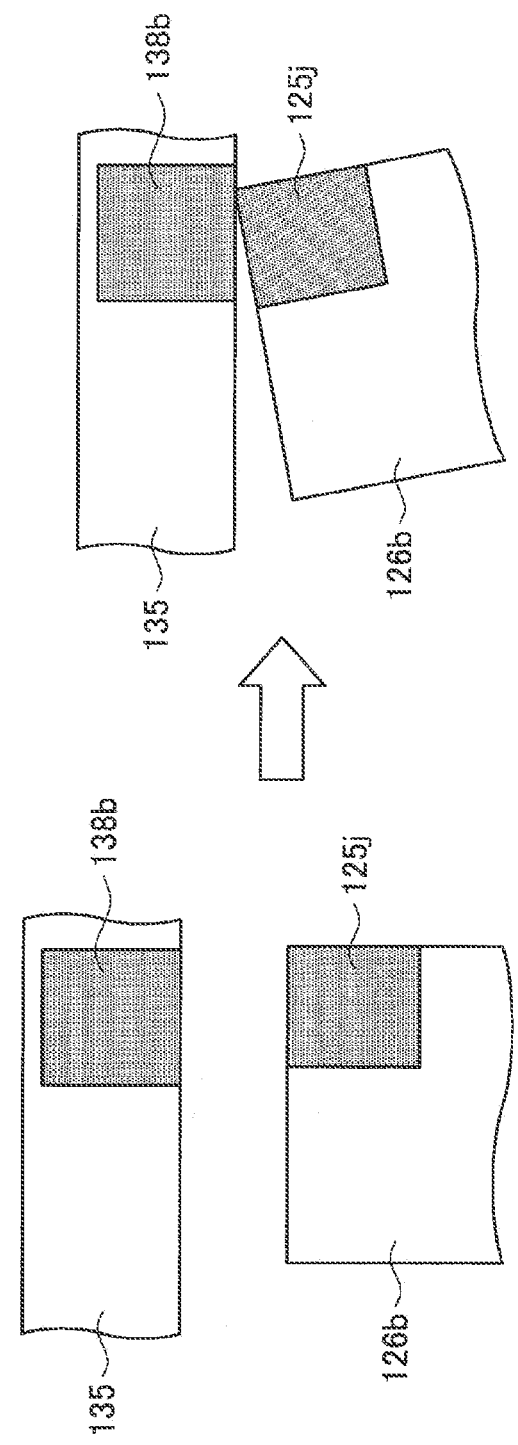
FIG. 16 is an explanatory diagram illustrating a case in which a contact portion between the stopper and the member facing the stopper is formed of the high yield stress material in the configuration in FIG. 14.

Similarly, the stopper 126b and the movable contact point portion 135 that faces the stopper 126b as illustrated in FIG. 14, for example, may be provided with high yield stress members 138b and 125j, respectively, as illustrated in FIG. 16. FIG. 16 is a partial enlarged view of the region R in FIG. 14. The portions, which are located closer to the side of the second fixed portion 125b that serves as the support point, of the stopper 126b and the movable contact point portion 135 are also brought into contact with each other first as illustrated in FIG. 14 in this case. Thus, it is possible to suppress the plastic deformation of the contact portion by providing the high yield stress members 138b and 125j at least on the side, which is closer to the support point, of the contact portion between the stopper 126b and the movable contact point portion 135.

6. Application Examples of Electronic Device

The electronic device with the aforementioned contact point structure is considered to be applied for various purposes.

[6.1. Use as Switch and Relay]

For example, the electronic device with the contact point structure according to each of the aforementioned embodiments can be used as a switch or a relay. The contact portion between the fixed contact point portion 125 and the movable contact point portion 135 is used for connection and disconnection of electric signals.

In consideration of a case where the electronic device 100B illustrated in FIG. 6 is used as a switch, for example, the section taken along each line (the line A-A, the line B-B, and the line C-C) in FIG. 6 is as illustrated in FIG. 17. As illustrated in the sectional view taken along the line A-A and the sectional view taken along the line B-B, the extending member 125d of the fixed contact point portion 125 is separated from the base portion 110. Meanwhile, the second fixed portion 125b of the fixed contact point portion 125 is integrally formed with the base portion 110 as illustrated in the sectional view taken along the line C-C. Therefore, since the extending member 125d of the fixed contact point portion 125 can move by being pressed by the movable contact point portion 135 when the fixed contact point portion 125 and the movable contact point portion 135 are brought into contact with each other, the plastic deformation at the contact point due to impact is suppressed. Since the interval between the fixed contact point portion 125 and the movable contact point portion 135 is constantly maintained, and the contact pressure can be substantially constantly maintained in this manner, contact resistance become constant, and reliability of the switch is enhanced. Also, it is possible to reduce earth capacity and to reduce an insertion loss by arranging the signal line extending from the metal pad 144 in the extending member 125d of the fixed contact point portion 125.

[6.2. Use as Opening and Closing Valve]

Use of the electronic device as an opening and closing valve device, for example, can be considered as another application example. The contact portion between the fixed contact point portion 125 and the movable contact point portion 135 is used as a flow rate adjustment valve of fluid (gas). The opening and closing valve device can be used as an actuator such as an air cylinder of a micro machine.

Figure 18:
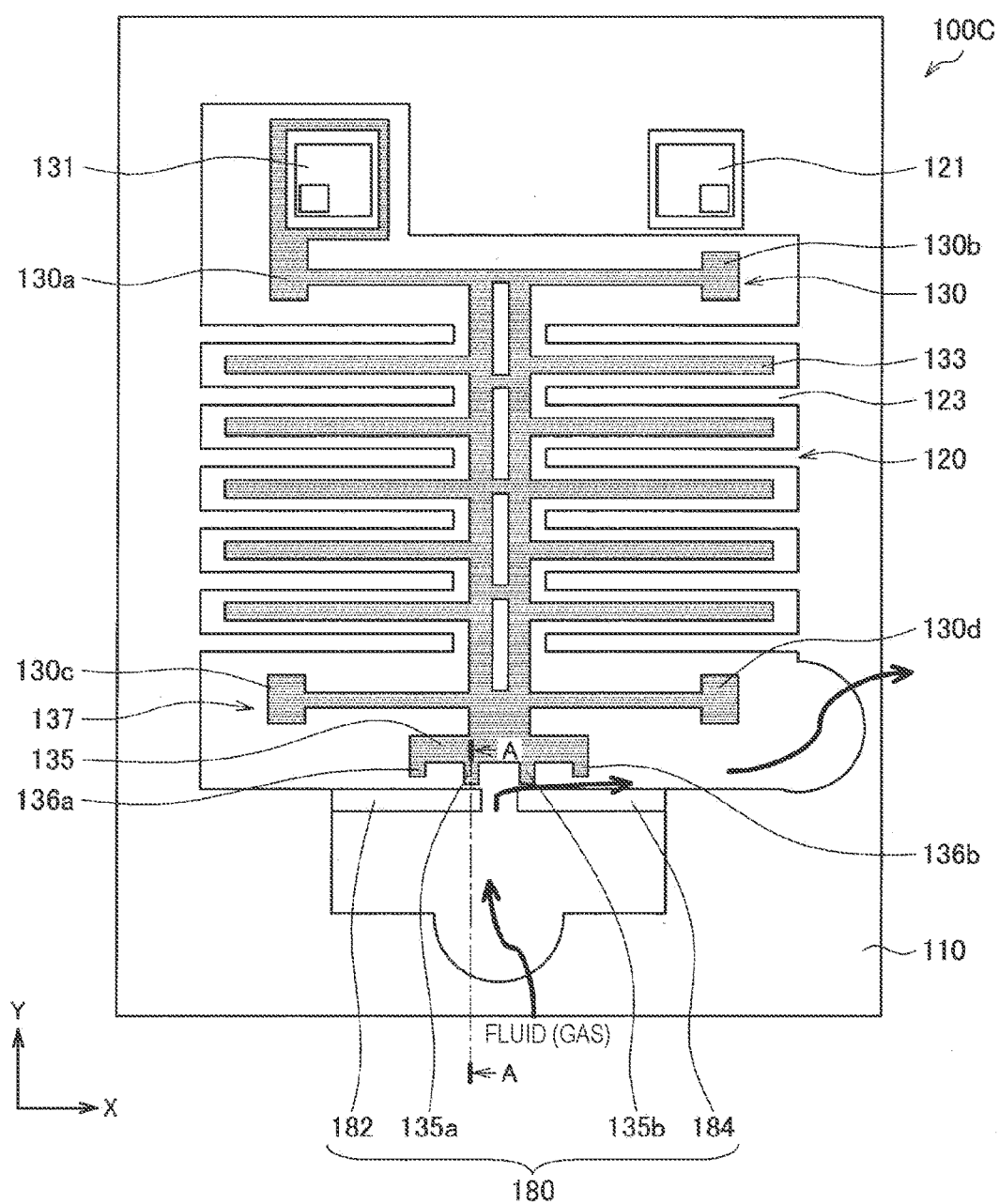
FIG. 18 is an outline planar view illustrating a configuration example when the electronic device is utilized as an opening and closing valve device.
Figure 19:
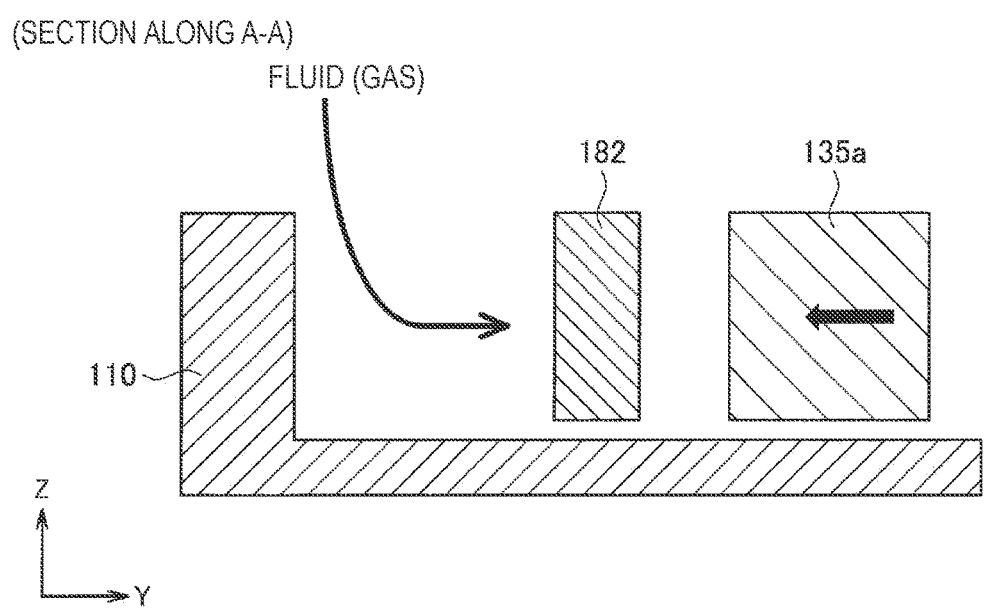
FIG. 19 is an outline sectional view taken along the line A-A in FIG. 18.

FIGS. 18 and 19 illustrate a configuration example of an opening and closing valve device 100C. FIG. 18 is an outline planar view illustrating a configuration example when the electronic device is used as the opening and closing valve device 100C. FIG. 19 is an outline sectional view taken along the line A-A in FIG. 18.

Although the opening and closing valve device 100C illustrated in FIG. 18 has substantially the same configuration as that of the electronic device 100B illustrated in FIG. 6, the opening and closing valve device 100C is different in that no signal pad 140 is provided. Also, fixed contact point portion 180 (182, 184) is provided as a member corresponding to the fixed contact point portion 125 in FIG. 6. A valve function of opening and closing a flow path for fluid is realized by bringing the movable contact point portion 135 into contact with the fixed contact point portion 180 and separating the movable contact point portion 135 therefrom.

The fixed contact point portions 182 and 184 extending from the base portion 110 are separated from the base portion 110 as illustrated in FIG. 19 and are displaced by being pressed by the movable contact point portion 135. Therefore, the plastic deformation of the contact point due to impact is suppressed as in each of the aforementioned embodiments. In this manner, the interval between the fixed contact point portions 182 and 184 and the movable contact point portion 135 is constantly held, and the contact pressure can be maintained to be substantially constant. As a result, it is possible to precisely perform the flow rate control and speed control of fluid.

As described above, the electronic device provided with the contact point structure according to each of the aforementioned embodiments can be used for various kinds of electronic apparatus. Specifically, the electronic device may be used as an acceleration sensor, an antenna switch, or the like provided in a smartphone, a wearable terminal, or the like. Alternatively, the electronic device may be used as a shift switch for a frequency circuit in an industrial device such as a semiconductor tester or a frequency inspection device. Since the electronic device according to the embodiment can substantially constantly hold the interval between the fixed contact point portion and the movable contact point portion, it is possible to provide a reliable electronic apparatus by using the electronic device.

7. Supplementary Note

Figure 20:
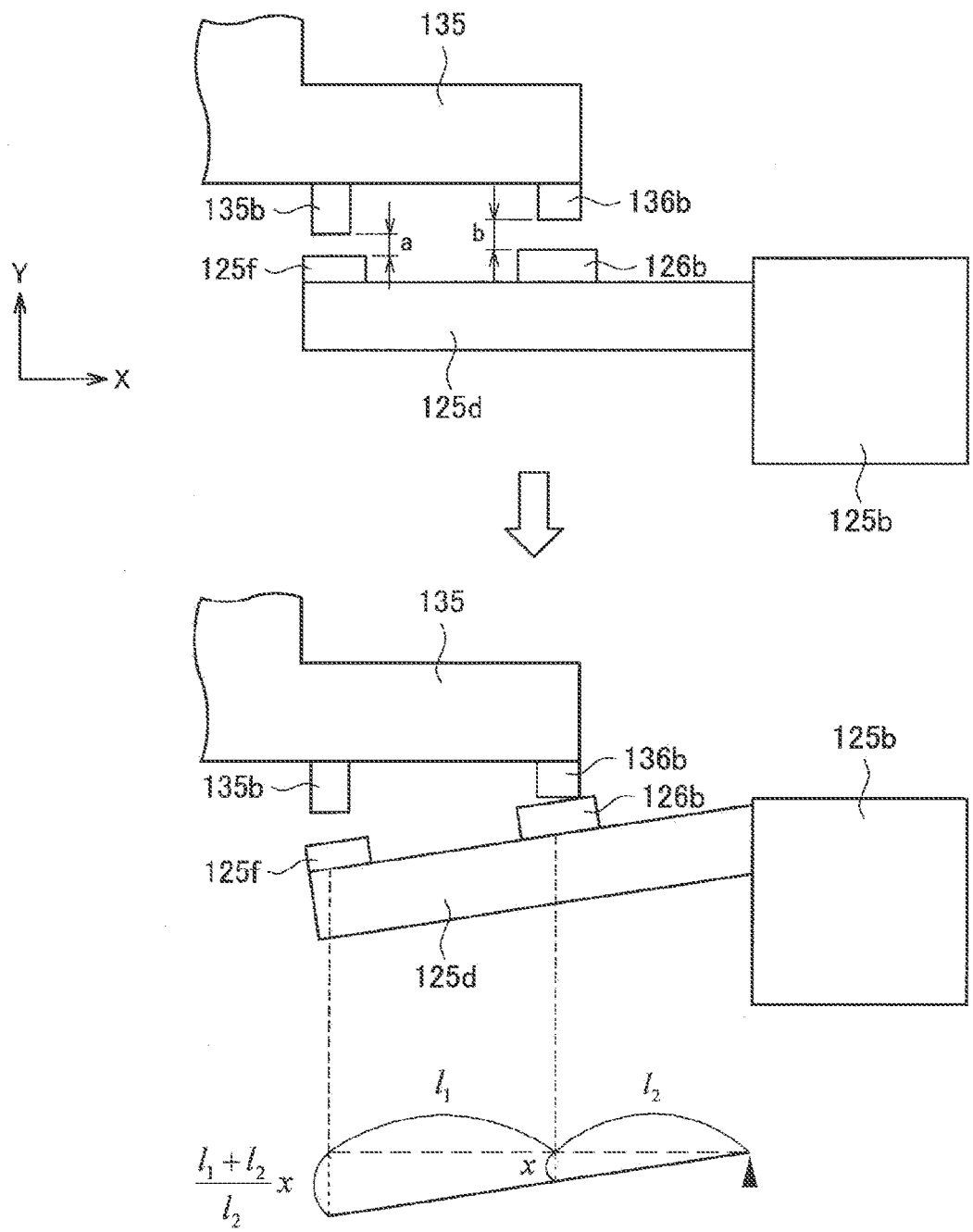
FIG. 20 is an explanatory diagram illustrating a positional relationship between the fixed contact point portion and the movable contact point portion in the contact point structure illustrated in FIG. 9.

In the configuration in which the stopper is provided in at least one of the fixed contact point portion 125 and the movable contact point portion 135 in the electronic devices according to the aforementioned embodiments, the protrusions 125f and 135b are brought into contact with each other first before the contact of the stoppers when the movable contact point portion 135 moves toward the side of the fixed contact point portion 125 from the initial state as described above. This point will be described in detail with reference to FIG. 20. FIG. 20 is a diagram illustrating a positional relationship between the fixed contact point portion 125 and the movable contact point portion 135 in the contact point structure illustrated in FIG. 9.

As illustrated in FIG. 20, it is assumed that the distance between the protrusions 125f and 135b in the initial state is a, and that the distance between the stoppers 126b and 136b is b. Also, it is assumed that the distance from the protrusion 125f to the stopper 126b is $l_1$, and that the distance from the stopper 126b to the second fixed portion 125b that serves as the support point is $l_2$. If the ratio between the distance $l_1$ and the distance $l_2$ ranges from 0.1 to 1000 at this time, the protrusions 125f and 135b are brought into contact with each other first before the contact of the stoppers when the movable contact point portion 135 moves toward the side of the fixed contact point portion 125 from the initial state.

When it is assumed that the distance by which the stopper 136b moves in the Y-axis direction before the contact state illustrated on the lower side in FIG. 20 is achieved from the initial state illustrated on the upper side in FIG. 20 is x, the distance of movement of the protrusion 135b in the Y-axis direction is represented as a $\{(l_1+l_2)/l_2\}$ fold of the distance x as illustrated in FIG. 20. Here, the relationship between the distances a and b and the distances of movement of the protrusion 135b and the stopper 136b from the initial state to the contact state is represented as the following Equation (1). If Equation (1) is transformed, and the aforementioned requirement for the ratio between the distance $l_1$ and the distance $l_2$ is applied thereto, the relationship between the distances a and b is obtained as the following Equation (2).

[Math. 1]

$$\left(\frac{l_1+l_2}{l_2}x - x\right) > (b-a) \tag{1}$$

$$\frac{l_1}{l_2} \times 1000 > (b-a) > \frac{l_1}{l_2} \times 0.1 \tag{2}$$

Therefore, the configuration in which the stopper is provided in at least one of the fixed contact point portion 125 and the movable contact point portion 135 among the electronic devices according to the aforementioned embodiments satisfies the aforementioned equation (2).

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)
A contact point structure including:
a base portion that is a semiconductor substrate;
a movable contact point portion that is supported by the base portion and is a part of a movable member capable of being driven in a predetermined direction; and
a fixed contact point portion that faces the movable contact point portion,
in which the fixed contact point portion includes a fixed portion that is supported by the base portion and an extending member that extends from the fixed portion and is capable of being displaced relative to the fixed portion.

(2)
The contact point structure according to (1),
in which at least one of the movable contact point portion and the fixed contact point portion includes a stopper at a position at which the movable contact point portion and the extending member of the fixed contact point portion face each other.

(3)
The contact point structure according to (2),
in which the stopper includes a metal.

(4)
The contact point structure according to (2),
in which the stopper includes a semiconductor material.

(5)
The contact point structure according to any one of (2) to (4), in which a ratio between a first distance from a contact portion between the fixed contact point portion and the movable contact point portion to an installation position of the stopper and a second distance from the installation position of the stopper to the fixed portion in an extending direction of the extending member of the fixed contact point portion is configured to be equal to or greater than 0.1 and equal to or less than 1000.

(6)

The contact point structure according to any one of (1) to (5), in which a conductive member is provided at a contact portion between the extending member of the fixed contact point portion and the movable contact point portion.

(7)

The contact point structure according to any one of (1) to (6), in which a high yield stress member is provided at at least a part of a contact portion between the extending member of the fixed contact point portion and the movable contact point portion.

(8)

The contact point structure according to (1), in which a contact point load suppression member supported by the base portion is provided at a position that faces the extending member of the fixed contact point portion.

(9)

An electronic device including:

the contact point structure according to any one of (1) to (8).

(10)

The electronic device according to (9), in which the electronic device is a switch, a relay device, or an opening and closing valve device.

(11)

An electronic apparatus including:

the electronic device according to (9) or (10).

REFERENCE SIGNS LIST 100A, 100B electronic device
110 base portion
120 fixed member
121 fixed electrode pad
123 fixed electrode
125, 180, 182, 184 fixed contact point portion
125a first fixed portion
125b second fixed portion
125c, 125d extending member
125f, 135b protrusion
125h, 135d, 148b, 149b, 138b, 125j high yield stress member
126a, 126b, 136a, 136b stopper
130 movable member
131 movable electrode pad
133 movable electrode
135 movable contact point portion
135a, 135b protrusion
140 signal pad
170 contact point load suppression member

What is claimed is:

1. A contact point structure comprising:
a movable member supported by a base portion and capable of being driven in a predetermined direction, the movable member including first and second movable contact point portions; and
a fixed member supported by the base portion, the fixed member including first and second fixed contact point portions that face the first and second movable contact point portions,
wherein the first fixed contact point portion includes:
a first fixed portion that is supported by the base portion; and
a first extending member that extends from the first fixed portion and is capable of being displaced relative to the first fixed portion, the first extending member including a first protrusion that protrudes toward the first movable contact point portion and that makes contact with the first movable contact point portion when the movable member is driven in the predetermined direction, wherein the second fixed contact point portion includes:
a second fixed portion that is supported by the base portion; and
a second extending member that extends from the second fixed portion and is capable of being displaced relative to the second fixed portion, the second extending member including a second protrusion that protrudes toward the second movable contact point portion and that makes contact with the second movable contact point portion when the movable member is driven in the predetermined direction, and
wherein the first and second extending members are spaced apart from one another in a direction that is perpendicular to the predetermined direction.

2. The contact point structure according to claim 1, wherein at least one of the first and second movable contact point portions and the first and second fixed contact point portions includes a stopper at a position at which a respective movable contact point portion and a respective extending member face each other.

3. The contact point structure according to claim 2, wherein the stopper includes a metal.

4. The contact point structure according to claim 2, wherein the stopper includes a semiconductor material.

5. The contact point structure according to claim 2, wherein a ratio between a first distance from a contact portion between a respective fixed contact point portion and the respective movable contact point portion to an installation position of the stopper and a second distance from the installation position of the stopper to a respective fixed portion in an extending direction of the respective extending member of the respective fixed contact point portion is configured to be equal to or greater than 0.1 and equal to or less than 1000.

6. The contact point structure according to claim 1, wherein a conductive member is provided at a contact portion between the first extending member of the first fixed contact point portion and the first movable contact point portion.

7. The contact point structure according to claim 1, wherein a high yield stress member is provided at least a part of a contact portion between the first extending member of the first fixed contact point portion and the first movable contact point portion.

8. The contact point structure according to claim 1, wherein a contact point load suppression member supported by the base portion is provided at a position that faces the first extending member of the first fixed contact point portion.

9. An electronic device comprising:
a base portion; and
a contact point structure including:
- a movable member supported by the base portion and capable of being driven in a predetermined direction, the movable member including first and second movable contact point portions; and
- a fixed member supported by the base portion, the fixed member including first and second fixed contact point portions that face the first and second movable contact point portions,
wherein the first fixed contact point portion includes:
- a first fixed portion that is supported by the base portion; and
- a first extending member that extends from the first fixed portion and is capable of being displaced relative to the first fixed portion, the first extending member including a first protrusion that protrudes toward the first movable contact point portion and that makes contact with the first movable contact point portion when the movable member is driven in the predetermined direction, wherein the second fixed contact point portion includes:
- a second fixed portion that is supported by the base portion; and
- a second extending member that extends from the second fixed portion and is capable of being displaced relative to the second fixed portion, the second extending member including a second protrusion that protrudes toward the second movable contact point portion and that makes contact with the second movable contact point portion when the movable member is driven in the predetermined direction, and
wherein the first and second extending members are spaced apart from one another in a direction that is perpendicular to the predetermined direction.

10. The electronic device according to claim 9, wherein the electronic device is a switch, a relay device, or an opening and closing valve device.

11. An electronic apparatus comprising:
a base portion including a semiconductor substrate; and
an electronic device including a contact point structure, the contact point structure including:
- a movable member supported by the base portion and capable of being driven in a predetermined direction, the movable member including first and second movable contact point portions; and
- a fixed member supported by the base portion, the fixed member including first and second fixed contact point portions that face the first and second movable contact point portions,
wherein the first fixed contact point portion includes:
- a first fixed portion that is supported by the base portion; and
- a first extending member that extends from the first fixed portion and is capable of being displaced relative to the first fixed portion, the first extending member including a first protrusion that protrudes toward the first movable contact point portion and that makes contact with the first movable contact point portion when the movable member is driven in the predetermined direction, wherein the second fixed contact point portion includes:
- a second fixed portion that is supported by the base portion; and
- a second extending member that extends from the second fixed portion and is capable of being displaced relative to the second fixed portion, the second extending member including a second protrusion that protrudes toward the second movable contact point portion and that makes contact with the second movable contact point portion when the movable member is driven in the predetermined direction, and
wherein the first and second extending members are spaced apart from one another in a direction that is perpendicular to the predetermined direction.

* * * * *